United States Patent

Raoux et al.

[11] Patent Number: 6,136,388
[45] Date of Patent: Oct. 24, 2000

[54] SUBSTRATE PROCESSING CHAMBER WITH TUNABLE IMPEDANCE

[75] Inventors: Sébastien Raoux, San Francisco; Mandar Mudholkar, Fremont; William N. Taylor, Dublin, all of Calif.

[73] Assignee: Applied Materials, Inc., Santa Clara, Calif.

[21] Appl. No.: 08/982,121

[22] Filed: Dec. 1, 1997

[51] Int. Cl.$^7$ ................................. H05H 1/24
[52] U.S. Cl. ........................... 427/569; 438/758
[58] Field of Search ............... 438/758; 427/569

[56] References Cited

U.S. PATENT DOCUMENTS

| | | | |
|---|---|---|---|
| 4,284,489 | 8/1981 | Weber | 204/298 |
| 4,450,787 | 5/1984 | Weakliem et al. | 118/723 |
| 4,854,263 | 8/1989 | Chang et al. | 118/715 |
| 4,947,085 | 8/1990 | Nakanishi et al. | 315/111.41 |
| 4,986,890 | 1/1991 | Setoyama et al. | 204/298.06 |
| 5,121,067 | 6/1992 | Marsland | 324/637 |
| 5,241,040 | 8/1993 | Cuomo et al. | 528/353 |
| 5,256,996 | 10/1993 | Marsland et al. | 333/20 |
| 5,267,020 | 11/1993 | Marsland et al. | 257/368 |
| 5,272,417 | 12/1993 | Ohmi | 315/111.21 |
| 5,352,994 | 10/1994 | Black et al. | 333/33 |
| 5,364,522 | 11/1994 | Wang | 205/50 |
| 5,378,939 | 1/1995 | Marsland et al. | 307/352 |
| 5,562,952 | 10/1996 | Nakahigashi et al. | 427/534 |
| 5,656,123 | 8/1997 | Salimian et al. | 156/345 |
| 5,795,452 | 11/1998 | Kinoshita et al. | 204/298.37 |

FOREIGN PATENT DOCUMENTS 9-213498  8/1997  Japan .

OTHER PUBLICATIONS

D.G. Hemmes et al., "Control of Stress, Stability, and Mechanical Properties of PECVD Dielectric Films for GaAs and Si Applications," *ECS 9th Symposium on Plasma Processing #131*, pp. 1–8.

A. Tsukune et al., "Properties of Silcon Nitride Films Prepared by Dual RF Plasma Deposition,"*Fujitsu Limited, Abstract No. 385*, p. 580.

E. van de Ven et al., Advantages of Dual Frequency PECVD for Deposition of ILD and Passivation Films, *7th International IEEE VLSI Multilevel Interconnection Conference*, Jun. 12–13, 1990, Santa Clara, CA, (Jun. 1990).

M. Lieberman et al., Principles of Plasma Discharges and Materials Processing, John Wiley & Sons, Inc., pp. 328–339, (1994).

*Primary Examiner*—Marian C. Knode
*Assistant Examiner*—Luz Alejandro
*Attorney, Agent, or Firm*—Townsend & Townsend & Crew

[57] ABSTRACT

A substrate processing system that includes a deposition chamber having a reaction zone, a plasma power source for forming a plasma within the reaction zone and an impedance tuner electrically coupled to the deposition chamber. When initially formed, the plasma has a first impedance level that can be adjusted by the impedance tuner to a second impedance level. In a preferred embodiment, the impedance tuner is a variable capacitor.

3 Claims, 15 Drawing Sheets

SUBSTRATE PROCESSING CHAMBER WITH TUNABLE IMPEDANCE

CROSS-REFERENCE TO RELATED APPLICATIONS

This application is related to concurrently filed and commonly assigned patent application Ser. No. 08/980,520 entitled "MIXED FREQUENCY CVD PROCESS AND APPARATUS," having Sébastien Raoux, Mandar Mudholkar, William N. Taylor, Mark Fodor, Judy Huang, David Silvetti, David Cheung and Kevin Fairbairn listed as co-inventors; and to concurrently filed and commonly assigned patent application Ser. No. 08/982,252 entitled "USE OF AN ASYMMETRIC WAVEFORM TO CONTROL ION BOMBARDMENT DURING SUBSTRATE PROCESSING," having Sébastien Raoux and Mandar Mudholkar listed as co-inventors; and to concurrently filed and commonly assigned patent application Ser. No. 08/988,246 entitled "METHOD AND APPARATUS FOR MONITORING AND ADJUSTING CHAMBER IMPEDANCE," having Sébastien Raoux, Mandar Mudholkar and William N. Taylor listed as co-inventors. This application is also related to U.S. patent application entitled "A HIGH TEMPERATURE CERAMIC HEATER ASSEMBLY WITH RF CAPABILITY AND RELATED METHODS," U.S. Ser. No. 08/800,096, filed Feb. 12, 1997, having Jun Zhao, Charles Dornfest, Talex Sajoto, Leonid Selyutin, Stefan Wolff, Lee Luo, Harold Mortensen and Richard Palicka listed as co-inventors. Each of the above referenced applications are assigned to Applied Materials Inc., the assignee of the present invention, and each of the above referenced applications are hereby incorporated by reference.

BACKGROUND OF THE INVENTION

The present invention relates to the fabrication of integrated circuits by chemical vapor deposition in a vacuum chamber. More particularly, the invention relates to a method and apparatus that enable the formation of high quality CVD films using both low temperature (e.g., about 400° C.) and high temperature (e.g., above about 580° C.) processing. The present invention is particularly useful in the deposition of TEOS-based (tetraethylorthosilicate) and silane-based chemistries including PECVD and SACVD deposition of silicon oxide, silicon nitride, silicon oxynitride and amorphous silicon as well as doped silicon oxides such as boron phosphorus silicate glass, phosphorus silicate glass and fluorine-doped silicate glass. The present invention may also, however, be used with other deposition chemistries.

One of the primary steps in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film.

An alternative method of depositing layers over a substrate includes plasma enhanced CVD (PECVD) techniques. Plasma enhanced CVD techniques promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. The relatively low temperature of some PECVD processes helps semiconductor manufacturers lower the overall thermal budget in the fabrication of some integrated circuits.

Semiconductor device geometries have dramatically decreased in size since such devices were first introduced several decades ago. Since then, integrated circuits have generally followed the eighteen month/half-size rule (often called "Moore's Law"), which means that the number of devices that will fit on a chip quadruples every eighteen months. Today's wafer fabrication plants are routinely producing integrated circuits having 0.5-$\mu$m and even 0.25-$\mu$m features, and tomorrow's plants soon will be producing devices having even smaller geometries.

Such decreases in size have been made possible in part by advances in technology associated with semiconductor manufacturing equipment, such as the substrate processing chambers used for PECVD processing. Some of the technology advances include advances that are reflected in the design and manufacture of certain CVD deposition systems in use in fabrication facilities today, while others are in various stages of development and will soon be in widespread use throughout the fabrication facilities of tomorrow.

One technology advance commonly used in today's fabrication facilities includes the use of a PECVD technique often referred to as mixed frequency PECVD in which both high and low frequency RF power are employed to generate a plasma and to promote ion bombardment of a substrate. One such mixed frequency method couples both high and low frequency RF power to a metal gas distribution manifold that acts as a first electrode. In this method, application of the high frequency RF power is the primary mechanism that dissociates the reactant gases while application of the low frequency RF power promotes ion bombardment of a substrate positioned on a grounded substrate support that also functions as a second electrode. Another mixed frequency method couples high frequency RF power to a gas distribution manifold (first electrode) and couples low frequency RF power to a substrate holder (second electrode).

Another technology advance used in some currently available PECVD deposition chambers includes the use of conical holes in the gas distribution manifold to increase the dissociation of gases introduced into a chamber. A more detailed description of such conical holes is contained in U.S. Pat. No. 4,854,263, entitled "INLET MANIFOLD AND METHODS FOR INCREASING GAS DISSOCIATION AND FOR PECVD OF DIELECTRIC FILMS," and having Mei Chang, David Wang, John White and Dan Maydan listed as co-inventors. The '263 patent is assigned to Applied Materials, the assignee of the present patent application, and is hereby incorporated by reference in its entirety.

An example of a technology advance that is more recent than those noted above is the use of ceramics in a CVD chamber to allow the reactor to be used in high temperature operations. One CVD chamber that is specifically designed for such high temperature processing and includes a ceramic heater assembly among other features of the chamber is described in the Ser. No. 08/800,896 application noted above.

Advances in technology such as those just described are not without restrictions. For example, while mixed frequency PECVD techniques have proved to be very beneficial in a variety of applications, the simultaneous application of the high and low frequency waveforms must be controlled to avoid interferences which can result in high voltages and arcing at the gas distribution manifold. Arcing may be evidenced by a glow within the holes in the gas distribution manifold, and by a reduction in deposition rate as the amplitude of the high frequency voltage is increased. Arcing is typically avoided using one or more of the following techniques: maintaining the pressure within the vacuum chamber above a de minimis level for a particular process, operating with the low frequency RF power set at a value less than 30% of the total RF power, and/or reducing total RF power.

In the past, experiments had been performed in which conical holes were employed in a mixed frequency PECVD chamber having both the high and low frequency RF power sources connected to the gas distribution manifold. In these experiments, it was found that the arcing problem was further increased to the point that it substantially interfered with film deposition. Thus, all mixed frequency PECVD systems known to the inventors use straight, rather than conical, holes in the gas distribution manifold.

Accordingly, it is desirable to develop technology for substrate deposition chambers that enables semiconductor manufacturers to simultaneously take advantage of conical holes and mixed frequency PECVD deposition techniques.

SUMMARY OF THE INVENTION

The present invention provides an improved method and apparatus for depositing CVD films on a substrate. The apparatus employs mixed frequency RF power and includes a gas distribution manifold with conical holes. The potential for arcing is greatly reduced by connecting the low frequency RF power source to an electrode embedded in the substrate holder and connecting the high frequency RF power source to the gas distribution manifold, which also functions as an electrode. An independent matching network decouples the low frequency waveform from the high frequency waveform to minimize phase interferences between the waveforms.

These features combine to allow deposition processes to proceed at conditions that were unattainable in prior substrate processing chambers and also enable the substrate processing apparatus of the present invention to be usable in sub-0.35 $\mu$m deposition processes including 0.25 and 0.18 $\mu$m processes.

A substrate processing system according to one embodiment of the present invention includes a ceramic substrate holder with an embedded RF electrode and a gas distribution manifold spaced apart from the substrate holder. The gas distribution manifold supplies one or more process gases through multiple conical holes to a reaction zone of a substrate processing chamber within the processing system and also acts as a second RF electrode. Each conical hole has an outlet that opens into the reaction zone and an inlet spaced apart from the outlet that is smaller in diameter than the outlet. A mixed frequency RF power supply is connected to the substrate processing system with a high frequency RF power source connected to the gas inlet manifold electrode and a low frequency RF power source connected to the substrate holder electrode. An RF filter and matching network decouples the high frequency waveform from the low frequency waveform. Such a configuration allows for an enlarged process regime and provides for deposition of films, including silicon nitride films, having physical characteristics that were previously unattainable.

In one preferred embodiment of the method of the present invention, a silicon nitride film is deposited. A process gas including silane, ammonia and molecular nitrogen is introduced through a gas distribution manifold having conical holes and a plasma is formed from the process gas using mixed frequency RF power. The high frequency (HF) component is applied to the gas distribution manifold while the low frequency (LF) component is applied to a bottom electrode. It has been demonstrated that silicon nitride films deposited according to this embodiment under low temperature processing conditions can have a wet etch rate (WER) as low as 170 Å/min while retaining excellent step coverage properties at aspect ratios of 2:1 or higher. It has also been demonstrated that silicon nitride films deposited according to this embodiment under high temperature processing conditions (above 580° C.) can have a WER of 15 Å/min or less.

In part, the excellent physical characteristics of these silicon nitride films are achieved because the films can be deposited at pressure and RF power levels that were previously not possible in other chambers. For example, in a more preferred embodiment, the ratio of LF power to total RF power is greater than 50%, while in another preferred embodiment, the silicon nitride deposition sequence takes place at a pressure between 2 and 5 torr. The physical characteristics are also achieved in part through the use of the conical holes, which in turn increases the plasma density and ionization efficiency of the created plasma thus allowing an increased amount of $N_2$ as compared with $NH_3$ to be used in the film's process gas. Reduced $NH_3$ content in the process gas results in less hydrogen in the film and a lower WER.

In another embodiment, a bipolar low frequency asymmetric RF waveform, also referred to as a triangular or sawtooth waveform, is employed to control ion bombardment. Such an asymmetric RF waveform enhances ion bombardment at the substrate while hindering the formation of harmonics, which the present inventors have discovered can provoke plasma sheath instabilities.

In another embodiment of the present invention, a substrate processing system includes a deposition chamber having a reaction zone, a plasma power source for forming a plasma within the reaction zone of the deposition chamber, and an impedance tuning system. The plasma has a first impedance level that can be adjusted by the impedance tuning system to a second impedance level. Such an adjustment acts as an additional "knob of control" providing another method for process engineers to use to change and tune the properties of films deposited within the reaction zone. In a preferred version of this embodiment, the impedance tuning system includes a variable capacitor.

In still another embodiment of the present invention, a substrate processing system includes a deposition chamber with a reaction zone, a substrate holder for holding a substrate in the reaction zone during substrate processing, a gas distribution system for supplying a process gas to the reaction zone, a plasma power source for forming, within the reaction zone, a plasma from the process gas and an impedance monitor that is electrically coupled to the deposition chamber and that can measure the impedance level of said plasma. The substrate processing system can also include a computer processor that receives the measured impedance level as an input. The processor can be connected to various systems of the substrate processing chamber, such as the gas distribution system, a pressure control system and/or the RF generator and adjust processing conditions according to the measured impedance level. Such an adjustment can be made, for example, near the end of an extended wafer run (e.g., a 2000 wafer run) where the measured impedance of the chamber may change during the course of the run. In this example, the processor could adjust processing conditions if, or when, the impedance level of the chamber drifted outside of a predefined range. The adjustment can include adjusting the chamber pressure, temperature, plasma power level (e.g., RF power level) or a similar process variable. Also, if the substrate processing system included an impedance tuning system, the adjustment could include directly adjusting the impedance of the chamber with that system.

These and other embodiments of the present invention, as well as its advantages and features are described in more detail in conjunction with the text below and attached figures.

For a further understanding of the present invention, reference should be made to the ensuing detailed description.

DETAILED DESCRIPTION OF THE INVENTION

I. The Hardware of CVD System 10

Figure 1:
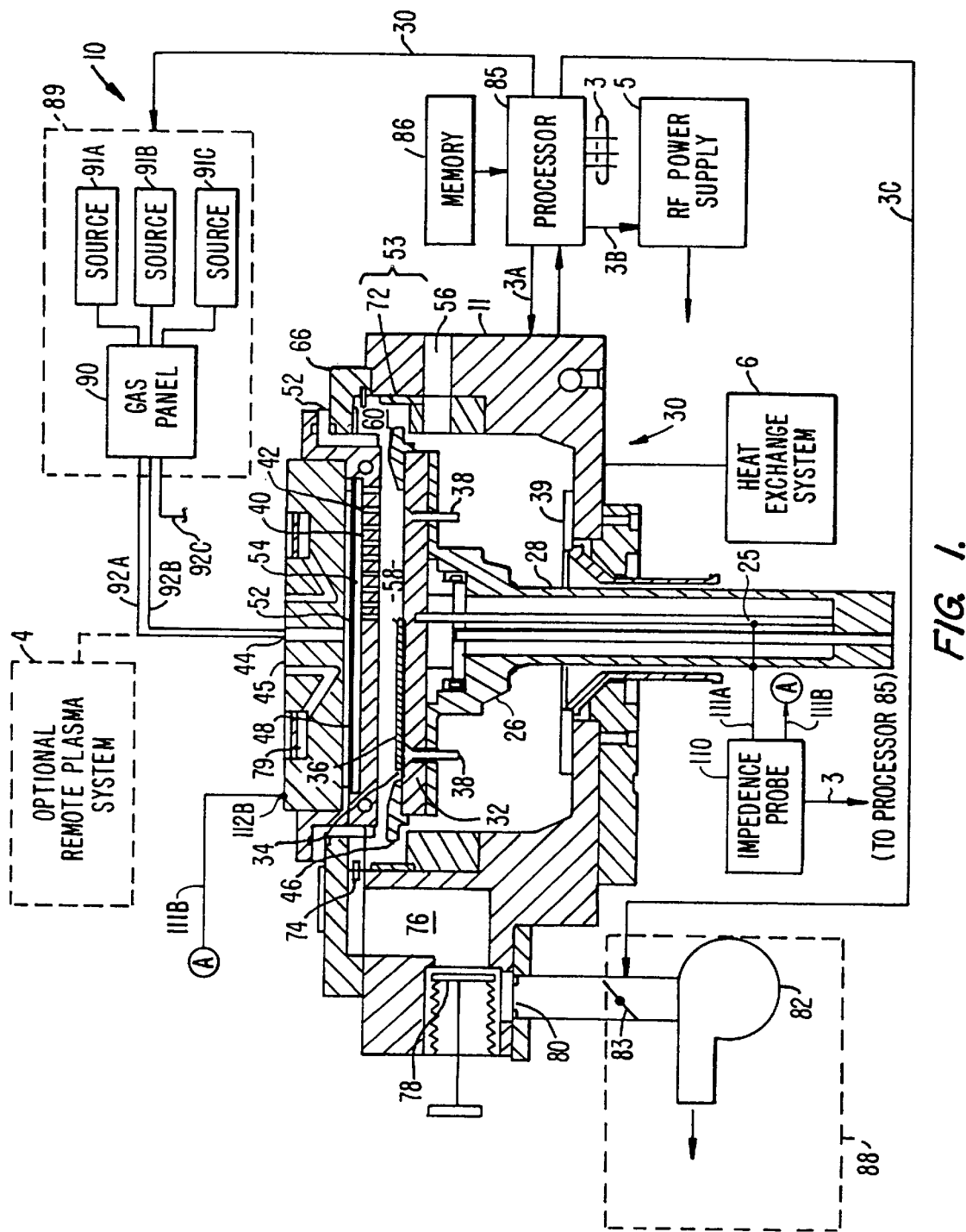
FIG. 1 is a block diagram of one embodiment of a deposition system according to the present invention, including a simplified cross-sectional view of the deposition chamber.

Referring to FIG. 1, a CVD system 10 according to the present invention includes a reactor chamber 30, a vacuum system 88, a gas delivery system 89, an RF power supply 5, a heat exchange system 6, a ceramic pedestal 32 and a processor 85 among other major components. Of particular interest to the discussion of the present invention is the configuration of a gas distribution manifold (also referred to as an inlet manifold and as a "showerhead") 40 that introduces process gases supplied from gas delivery system 89 into a reaction zone 58 of chamber 30 and the configuration and connections of RF power supply 5 to manifold 40 and to an electrode embedded within pedestal 32. Accordingly, these components will be described first and other components of CVD system 10 will be described subsequently as necessary to understand the present invention.

A. Gas Delivery System 89

Referring still to FIG. 1, gas delivery system 89 delivers gases to chamber 30 via gas lines 92A–C. Gas delivery system 89 includes gas supply panel 90 and gas or liquid or solid sources 91A–C (additional sources may be added if desired), containing gases (such as $SiH_4$ or $N_2$) or liquids (such as TEOS) or solids that may vary depending on the desired processes used for a particular application. Generally, the supply line for each of the process gases includes a shut-off valve (also not shown) that can be used to automatically or manually shut off the flow of process gas, as well as a mass flow controller (not shown) that measures the flow of gas or liquid through each of the supply lines. The rate at which the process and carrier gases including, for example, silane ($SiH_4$), helium (He), nitrogen ($N_2$) and/or other dopant or reactant sources, are supplied to reaction chamber also is controlled by temperature-based liquid or gas mass flow controllers (MFCs) (not shown) and/or by valves (not shown). Of course, it is recognized that other compounds may be used as deposition and clean sources. In alternative embodiments, the rate at which the process and carrier gases are supplied to reaction chamber 30 may be controlled by a pressure-based fixed or variable aperture. When toxic gases (for example, ozone or halogenated gas) are used in the process, the several shut-off valves may be positioned on each gas supply line in conventional configurations.

Gas supply panel 90 has a mixing system that receives the deposition process and carrier gases (or vaporized liquids) from the sources 91A–C for mixing and sending to a central gas inlet 44 in a gas feed cover plate 45 via supply lines 92A–C (other lines may be present, but are not shown). In this specific embodiment, the mixing system, the input manifold to the mixing system, and the output manifold from the mixing system to the central inlet 44 are made of nickel or of a material such as alumina plated with nickel.

When a liquid source is used, there are many different ways to introduce the source into chamber 30 as known to those of skill in the art. One such way is to confine and heat the liquid in an ampule so that the vapor pressure provides a stable flow of the vaporized source that is sufficient for the deposition process. Another way to introduce a source gas using a liquid source is to bubble a carrier gas, such as helium, through the liquid. Still another way is to use a liquid injection system that vaporizes a measured quantity of liquid into a carrier gas stream. A liquid injection system is preferred in some instances as it provides greater control of the volume of reactant liquid introduced into the gas mixing system compared to bubbler-type sources.

B. Gas Distribution Manifold 40 with Conical Holes 42

The process gas is injected into reactor 30 through central gas inlet 44 in gas-feed cover plate 45 to a first disk-shaped space 48 and from thence through passageways (not shown) in a baffle plate (or gas blocker plate) 52 to a second disk-shaped space 54 to showerhead 40. Showerhead 40 includes a large number of holes or passageways 42 for jetting the process gas into reaction zone 58.

Figure 4A:
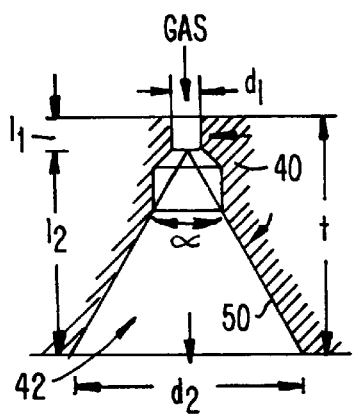
FIGS. 4A and 4B are cross-sectional views of embodiments of conical holes included within the gas distribution manifold.

Preferably, each of the holes 42 is a "conical hole" as described in detail in U.S. Pat. No. 4,854,263 previously incorporated by reference and as shown in FIG. 4A. FIG. 4A is a schematic view of a preferred conical hole that represents one of the many holes in showerhead 40. Each conical hole has a conical section 50 that faces the substrate during processing. The holes are sized to promote laminar flow through showerhead 40. The presence of conical section 50 within the gas distribution hole improves the dissociation of reaction gases thereby increasing the plasma density and the ionization efficiency. The improved dissociation is particularly beneficial when gases that are difficult to break apart such as $N_2$ are used for deposition.

Figure 4B:
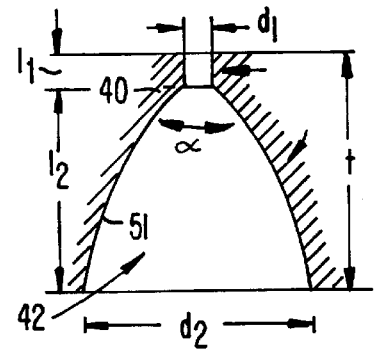

As used herein, the term "conical hole" refers to any hole designed to increase dissociation and reactivity of gases introduced into reaction zone 58 through the hole where the diameter of the gas outlet is larger than the diameter of the gas inlet. Thus, vertical cross-sectional shapes other than cones are included within the meaning of "conical hole" as used herein. Another example of a conical hole is shown in FIG. 4B. The hole shown in FIG. 4B has a concave cross-section 51. Still other holes having other vertical cross-sections including convex, parabolic, hyperbolic, bowl-shaped and semi-ellipsoidal among others can also be used.

Returning to FIG. 1, the process gas jets from holes 42 in showerhead 40 into reaction zone 58 between the showerhead and the pedestal so as to react at the surface of wafer 36. The process gas byproducts then flow radially outward across the edge of wafer 36 and a flow restrictor ring 46, which is disposed on the upper periphery of pedestal 32 when pedestal 32 is in the processing position. From thence, the process gas flows through a choke aperture formed between the bottom of annular isolator 64 and the top of chamber wall liner assembly 53 into pumping channel 60.

A vacuum system 88 is used to maintain a specified pressure in the chamber and remove gaseous byproducts and spent gases from the chamber. Vacuum system 88 includes a vacuum pump 82 and a throttle valve 83. Upon entering pumping channel 60, the exhaust gas is routed around the perimeter of the process chamber, to be evacuated by a vacuum pump 82. Pumping channel 60 is connected through exhaust aperture 74 to pumping plenum 76. Exhaust aperture 74 restricts the flow between the pumping channel and the pumping plenum. Valve 78 gates the exhaust through exhaust vent 80 to vacuum pump 82. Throttle valve 83 is controlled by processor 85 according to a pressure control program stored in memory 86 which compares a measured signal from a pressure sensor (not shown), such as a manometer, against a desired value that is stored in memory or generated according to the control program. Pumping channel 60 and its components are designed to minimize the effects of unwanted film deposition by directing the process gas and byproducts into the exhaust system.

C. Ceramic Pedestal 32

Returning to FIG. 1, a resistively-heated, ceramic pedestal 32 supports wafer 36 in a wafer pocket 34. Pedestal 32 may be moved vertically between a processing position (for example, as shown in FIG. 1) and a lower loading position using a self-adjusting lift mechanism, described in detail in commonly assigned U.S. patent application Ser. No. 08/738, 240, (filed on Oct. 25, 1996 and having inventors Leonid Selyutin and Jun Zhao), entitled "Self-Aligning Lift Mechanism." With pedestal 32 in the lower loading position (slightly lower than at slit valve 56), a robot blade (not shown) in cooperation with the lift pins and the lifting ring transfers wafer 36 in and out of chamber 30 through slit valve 56, which can be vacuum-sealed to prevent the flow of gas into or out of the chamber through slit valve 56. Lift pins 38 raise an inserted wafer (not shown) off the robot blade, and then the pedestal rises to raise the wafer off the lift pins onto the wafer pocket on the upper surface of the pedestal. A suitable robotic transfer assembly is described in commonly assigned U.S. Pat. No. 4,951,601, issued to Maydan et al. Through the use of the self-aligning lift mechanism, pedestal 32 then further raises wafer 36 into the processing position, which is in close proximity to gas distribution manifold 40.

Figure 2:
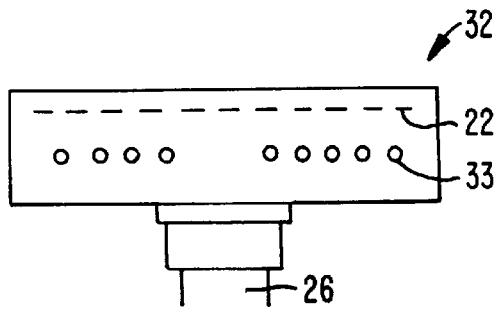
FIG. 2 shows a simplified cross-sectional view of the ceramic pedestal attached to a support stem according to one embodiment of the present invention.

As shown in FIG. 2, which is a simplified cross-sectional view of pedestal 32, ceramic pedestal 32 includes an embedded RF electrode 22, such as an embedded molybdenum mesh, and a heating element 33, such as an embedded molybdenum wire coil. Ceramic pedestal 32 is preferably made from aluminum nitride and is preferably diffusion bonded to a ceramic support stem 26 that is secured to a water cooled aluminum shaft 28 (not shown in FIG. 2, but shown in FIG. 1) that engages a lift motor. The ceramic support stem 26 and the aluminum shaft 28 have a central passage that is occupied by a nickel rod 25 that transmits low frequency RF power to embedded electrode 22. The central passage is maintained at atmospheric pressure to avoid arcing and corrosive attacks at the metal-to-metal connections.

Figure 3:
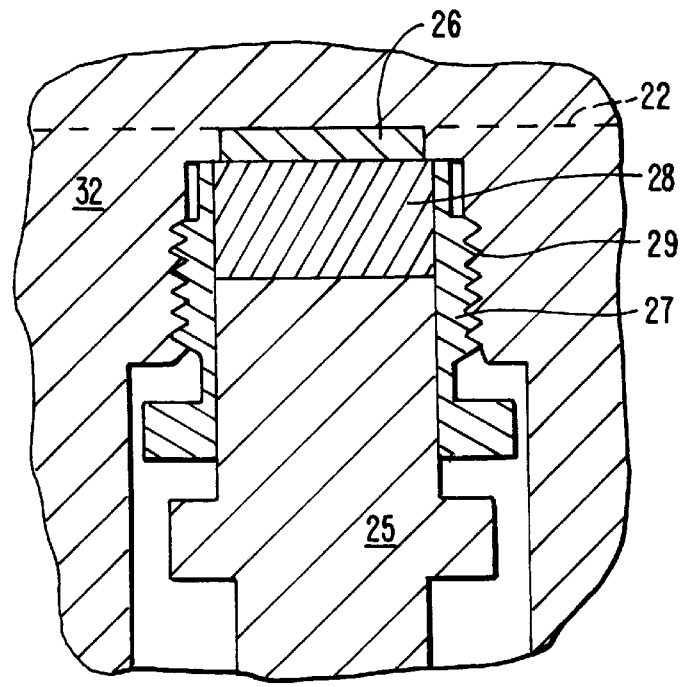
FIG. 3 is a schematic diagram of a metal/ceramic connection for a preferred ceramic substrate holder having an embedded RF electrode.

FIG. 3 is a schematic diagram of a preferred metal-to-ceramic connection for suppling RF power to the RF electrode 22 embedded in ceramic substrate holder 32. As shown in FIG. 3, nickel rod 25 is brazed to a nickel eyelet 27 having external threads 29 that engage internal threads in the substrate holder 32. A covar plug 28 is brazed to the end of nickel rod 25 within eyelet 27. A molybdenum pellet 26 is cosintered with the AlN substrate holder in contact with RF electrode 22. Covar plug 28 is then brazed to molybdenum pellet 26 to securely attach nickel rod 25 to RF electrode 22. A silver/titanium brazing alloy is preferred.

Ceramic pedestal 32 is manufactured to provide uniform capacitance by embedding RF electrode 22 at a uniform depth below the surface of the substrate holder. RF electrode 22 is preferably positioned at a minimum depth, which depends on the ceramic material, to provide maximum capacitance while avoiding cracking or flaking of the thin ceramic layer which covers the RF electrode 22. In one embodiment, RF electrode 22 is embedded about 40 mil beneath the upper surface of pedestal 32.

D. RF Power Supply 5 and Filter/Matching Network

Figure 5:
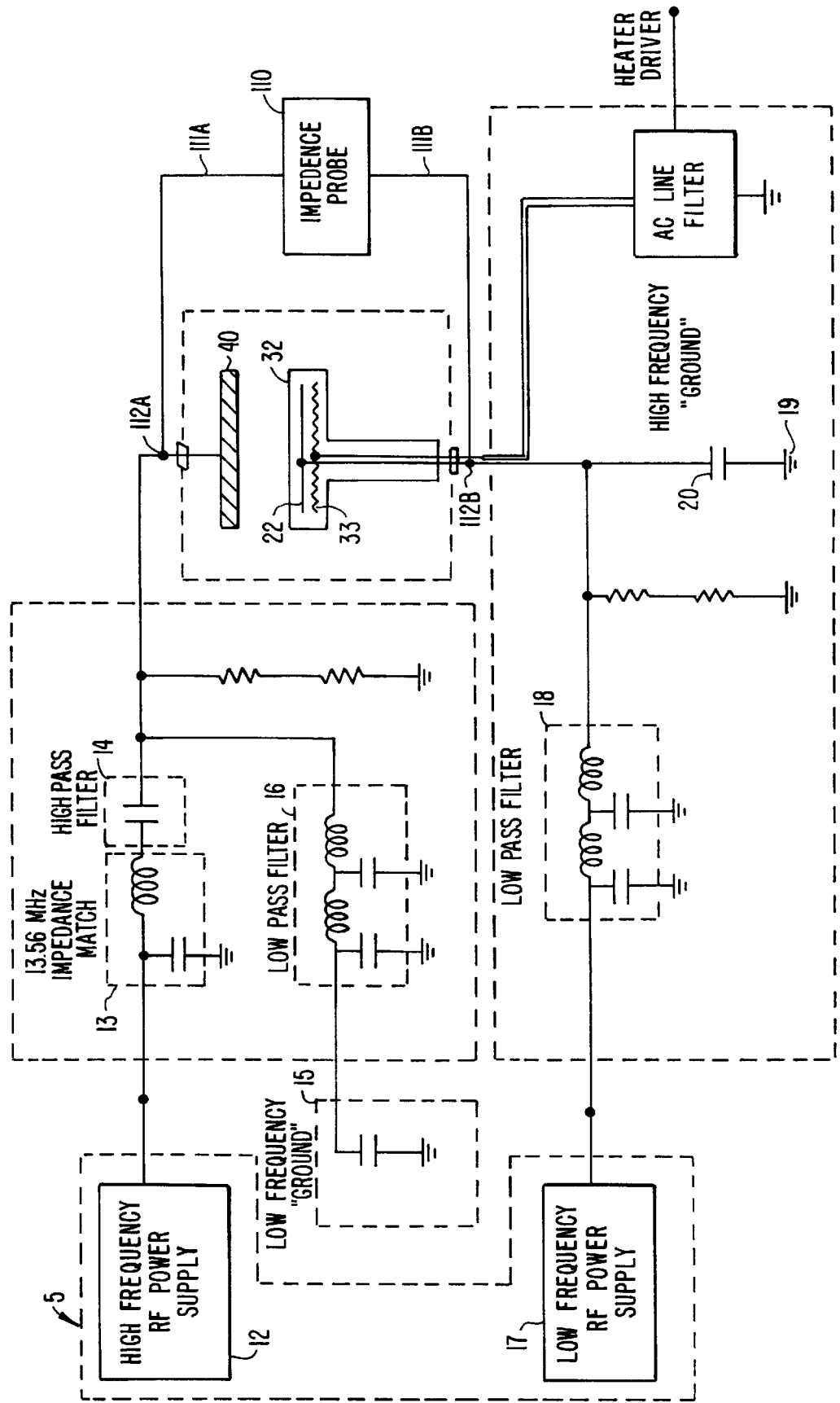
FIG. 5 is a simplified diagram showing an embodiment of the RF filter and matching network employed to decouple the low and high frequency RF waveforms in the apparatus of the present invention.

An RF power supply 5 provides both high and low radio frequency (RF) power to the chamber for plasma-enhanced processes. FIG. 5 is a schematic circuit diagram showing an external RF circuit that includes a high frequency RF source 12 and a low frequency RF source 17. The circuit inputs high frequency RF power to gas distribution manifold 40 of chamber 30 shown in FIG. 1 and inputs low frequency RF power to RF electrode 22 embedded in substrate holder 32.

The high and low frequency RF waveforms are decoupled by a network of high pass and low pass filters. The low frequency amplitude is maximized at the plasma sheath located at the surface of the substrate support and is minimized at the gas distribution system. The high frequency amplitude is maximized at the plasma sheath adjacent the gas distribution system and the high frequency voltage is minimized at the surface of the substrate support. The gas distribution system is a "pseudo-ground" for the low frequency RF power and the voltage is minimized to prevent arcing. Decoupling of the low and high frequency RF power results in a decrease of the self DC bias as low frequency power increases. Thus, ion energy is directly controlled by the low frequency RF signal voltage amplitude through the bottom plasma sheath.

Interference between the high and low frequency RF power is minimized across the top and bottom plasma sheaths by an external RF match unit that which matches the impedance at high frequency RF and the impedance of the decoupled low frequency. Otherwise, the interferences would produce high voltages at the electrodes and result in arcing at the gas distribution system damaging the showerhead. The use of a low frequency bottom plasma sheath and a predominantly high frequency top plasma sheath induces a harmonic oscillation frequency that may be increased or decreased by the external RF circuit as desired.

As shown in FIG. 5, high frequency RF source 12 is connected to a high frequency impedance match unit 13 and a high pass filter 14 that shields high frequency RF source 12 from low frequency RF power. High frequency RF source 12 is also shielded from a low frequency ground 15 by a low pass filter 16. Low frequency RF source 17 is connected to a low pass filter 18 that shields the low frequency RF source from high frequency RF power. The low frequency input is also shielded from a high frequency ground 19 that includes a high pass filter 20.

RF power delivery provided by the configuration shown in FIG. 5 is designed to maximize the 13.56 MHz voltage amplitude for efficient electron impact dissociation and minimize the low frequency oscillation at the showerhead electrode. Indeed, as described in more detail below, the present inventors discovered that phase and potential interferences between the low and high frequencies should be minimized at the conical holes in showerhead 40 to prevent plasma instabilities and microarcing. The RF network is also designed to maximize the low frequency potential at the lower electrode which represents a "pseudo-ground" for the 13.56 MHz signal. This limits the 13.56 MHz oscillation at the lower electrode and prevents formation of a self DC bias (<20 V), so that the ion energy can be directly controlled by the LF voltage amplitude. As a result, there can be a reduction of charging effects at the wafer surface and a reduction of plasma induced damages.

While in general it is desirable to hinder the formation of harmonics, it is possible in certain embodiments to use the external match circuitry described above to amplify the harmonics created within the plasma sheath. For example, the frequency and amplitude of the harmonics can be tuned by varying the external capacitance of capacitor 20 at the bottom RF match. Through mathematical modeling using SPICE (simulated program while integrated circuit emphasis), the inventors observed that a very strong resonance can be tuned. These calculations proved that with capacitor 20 selected to have a capacitance of 1500 pF, the resonance frequency of the harmonics was approximately 3 MHz and the amplitude of oscillation was higher than the oscillation amplitude at 13.56 MHz. It is believed that this phenomenon can be attributed to ion resonance, and which, if properly tuned, can be used to introduce a desirable sputtering component into the deposition process or to tune the nature and concentration of the reactive species in the plasma.

E. Other Components

Referring back to FIG. 1, a liquid heat exchange system 6 employs a liquid heat exchange medium, such as water or a water-glycol mixture, to remove heat from the reactor chamber and maintain certain portions of the chamber at a suitable temperature for stable process temperatures. Liquid heat exchange system 6 delivers liquid to various components of chamber 30 to maintain these components at a suitable temperature during the high temperature processing. This system 6 acts to decrease the temperature of some of these chamber components in order to minimize undesired deposition onto these components due to the high temperature processes. As seen in FIG. 1, heat exchange passages 79 within gas feed cover plate 45 allow the heat exchange liquid to circulate through gas feed cover plate 45, thus maintaining the temperature of gas feed cover plate 45 and adjacent components. Liquid heat exchange system 6 includes connections (not shown) that supply the liquid (such as water) through a heat exchange liquid manifold (not shown) for delivering the liquid to the gas distribution system including showerhead 40 (discussed below). A water flow detector detects the water flow from a heat exchanger (not shown) to enclosure assembly.

Motors and optical sensors (not shown) are used to move and determine the position of movable mechanical assemblies such as throttle valve 83 and pedestal 32. Bellows (not shown) attached to the bottom of pedestal 32 and chamber body 11 form a movable gas-tight seal around the pedestal. The pedestal lift system, motors, gate valve, plasma system, including an optional remote plasma system 4 (which may be used to provide chamber clean capability using a remote plasma formed using, for example, a microwave source), and other system components are controlled by processor 85 over control lines 3 and 3A–D, of which only some are shown, as described in more detail below.

II. System Control of CVD System 10

Processor 85 executes system control software, which is a computer program stored in a memory 86 coupled to processor 85. Preferably, memory 86 may be a hard disk drive, but memory 86 may be other kinds of memory. In addition to memory 86, processor 85 includes a floppy disk drive and a card rack. Processor 85 operates under the control of the system control software, which includes sets of instructions that dictate the timing, mixture of gases, gas flow, chamber pressure, chamber temperature, RF power levels, heater pedestal position, heater temperature and other parameters of a particular process. Other computer programs such as those stored on other memory including, for example, a floppy disk or other computer program product inserted in a disk drive or other appropriate drive, may also be used to operate processor 85. System control software will be discussed in detail below. The card rack contains a single-board computer, analog and digital input/output boards, interface boards and stepper motor controller boards. Various parts of CVD apparatus 10 conform to the Versa Modular European (VME) standard, which defines board, card cage, and connector dimensions and types. The VME standard also defines the bus structure having a 16-bit data bus and 24-bit address bus.

Figure 6:
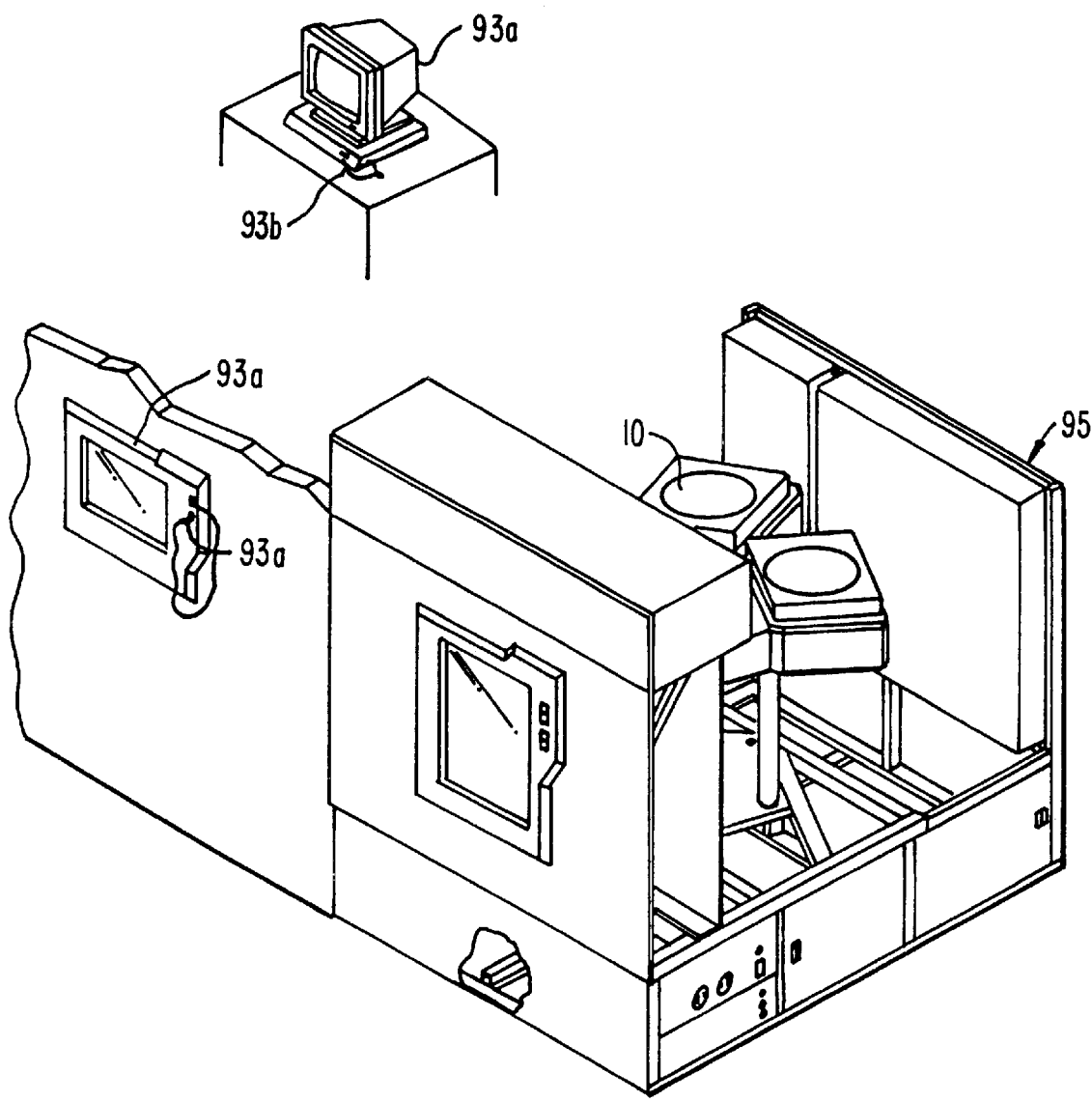
FIG. 6 shows an interface between a user and a processor that can control the deposition system of the present invention.

The interface between a user and processor 85 is via a CRT monitor 93a and a light pen 93b, shown in FIG. 6, which is a simplified diagram of the system monitor and CVD apparatus 10, illustrated as one of the chambers in a multichamber system. CVD apparatus 10 is preferably attached to a mainframe unit 95 that contains and provides electrical, plumbing and other support functions for the apparatus 10. Exemplary mainframe units compatible with the illustrative embodiment of CVD apparatus 10 are currently commercially available as the Precision 5000™ and the Centura 5200™ systems from Applied Materials, Inc. of Santa Clara, Calif. The multichamber system has the capability to transfer a wafer between its chambers without breaking the vacuum and without exposing the wafer to moisture or other contaminants outside the multichamber system. An advantage of the multichamber system is that different chambers in the multichamber system may be used for different purposes in the entire process. For example, one chamber may be used for deposition of a metal film, another may be used for rapid thermal processing, and yet another may be used for depositing an anti reflective layer. The process may proceed uninterrupted within the multichamber system, thereby preventing contamination of wafers that may otherwise occur when transferring wafers between various separate individual chambers (not in a multichamber system) for different parts of a process.

In the preferred embodiment two monitors 93a are used, one mounted in the clean room wall for the operators and the other behind the wall for the service technicians. Both monitors 93a simultaneously display the same information, but only one light pen 93b is enabled. The light pen 93b detects light emitted by CRT display with a light sensor in the tip of the pen. To select a particular screen or function, the operator touches a designated area of the display screen and pushes the button on the pen 93b. The touched area changes its highlighted color, or a new menu or screen is displayed, confirming communication between the light pen and the display screen. Of course, other devices, such as a keyboard, mouse, or other pointing or communication device, may be used instead of or in addition to light pen 93b to allow the user to communicate with processor 85.

The processes for depositing the film and for dry cleaning the chamber can be implemented using a computer program product that is executed by processor 85. The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of precompiled Windows library routines. To execute the linked, compiled object code, the system user invokes the object code, causing the computer system to load the code in memory, from which the CPU reads and executes the code to perform the tasks identified in the program.

Figure 7:
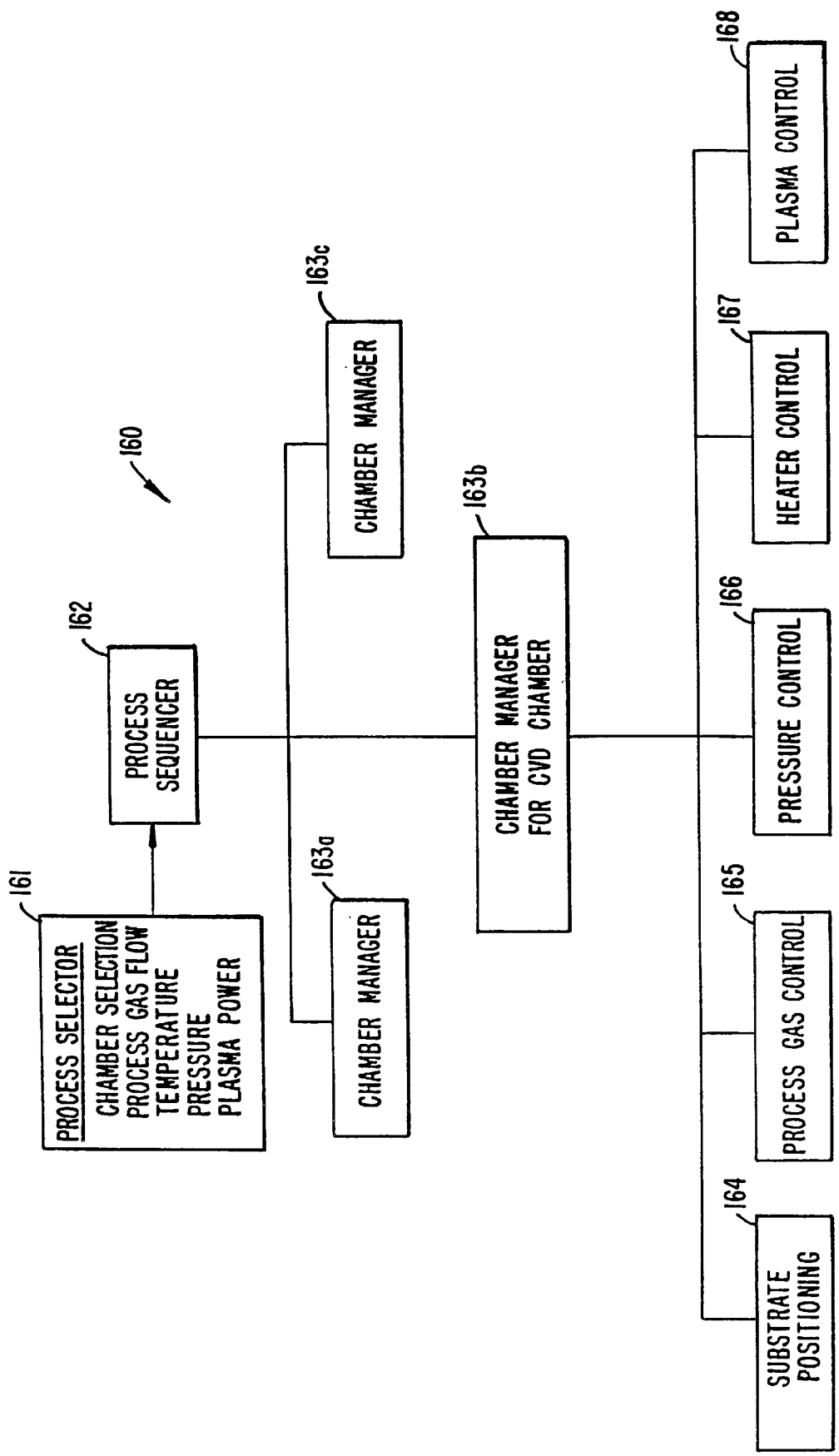
FIG. 7 is a flow chart of a process control computer program product used in conjunction with the exemplary CVD plasma reactor of FIG. 1.

FIG. 7 is an illustrative block diagram of the hierarchical control structure of the system control software, computer program 160, according to a specific embodiment. Using a light pen interface, a user enters a process set number and process chamber number into a process selector subroutine 161 in response to menus or screens displayed on the CRT monitor. The process sets, which are predetermined sets of process parameters necessary to carry out specified processes, are identified by predefined set numbers. Process selector subroutine 161 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as high- and low-frequency RF power levels and the high-frequency and low-frequency RF frequencies (and in addition, microwave generator power levels for embodiments equipped with remote microwave plasma systems), cooling gas pressure, and chamber wall temperature. Process selector subroutine 161 controls what type of process (deposition, wafer cleaning, chamber cleaning, chamber gettering, reflowing) is performed at a certain time in chamber 30. In some embodiments, there may be more than one process selector subroutine. The process parameters are provided to the user in the form of a recipe and may be entered utilizing the light pen/CRT monitor interface.

The signals for monitoring the process are provided by the analog input board and digital input board of the system controller, and the signals for controlling the process are output on the analog output board and digital output board of CVD system 10.

A process sequencer subroutine 162 comprises program code for accepting the identified process chamber and set of process parameters from process selector subroutine 161, and for controlling operation of the various process chambers. Multiple users can enter process set numbers and process chamber numbers, or a single user can enter multiple process set numbers and process chamber numbers, so sequencer subroutine 162 operates to schedule the selected processes in the desired sequence. Preferably, sequencer subroutine 162 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out. Conventional methods of monitoring the process chambers can be used, such as polling. When scheduling which process is to be executed, sequencer subroutine 162 can be designed to take into consideration the present condition of the process chamber being used in comparison with the desired process conditions for a selected process, or the "age" of each particular user-entered request, or any other relevant factor a system programmer desires to include for determining scheduling priorities.

Once sequencer subroutine 162 determines which process chamber and process set combination is going to be executed next, the sequencer subroutine 162 initiates execution of the process set by passing the particular process set parameters to a chamber manager subroutine 163a–c that controls multiple processing tasks in a process chamber 30 according to the process set determined by sequencer subroutine 162. For example, the chamber manager subroutine 163b comprises program code for controlling CVD operations in process chamber 30. Chamber manager subroutine 163b also controls execution of various chamber component subroutines that control operation of the chamber components necessary to carry out the selected process set. Examples of chamber component subroutines are substrate positioning subroutine 164, process gas control subroutine 165, pressure control subroutine 166, heater control subroutine 167, and plasma control subroutine 168. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in process chamber 30. In operation, chamber manager subroutine 163b selectively schedules or calls the process component subroutines in accordance with the particular process set being executed. Chamber manager subroutine 163b schedules the process component subroutines much like sequencer subroutine 162 schedules which process chamber 30 and process set are to be executed next. Typically, chamber manager subroutine 163b includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIG. 7. Substrate positioning subroutine 164 comprises program code for controlling chamber components that are used to load the substrate onto pedestal 32 and, optionally, to lift the substrate to a desired height in chamber 30 to control the spacing between the substrate and showerhead 40. When a substrate is loaded into process chamber 30, heater assembly 33 is lowered to receive the substrate in wafer pocket 34, and then is raised to the desired height. In operation, substrate positioning subroutine 164 controls movement of pedestal 32 in response to process set parameters related to the support height that are transferred from chamber manager subroutine 163b.

Process gas control subroutine 165 has program code for controlling process gas composition and flow rates. Process gas control subroutine 165 controls the open/close position of the safety shut-off valves, and also ramps up/down the mass flow controllers to obtain the desired gas flow rate. Process gas control subroutine 165 is invoked by the chamber manager subroutine 163b, as are all chamber component subroutines, and receives subroutine process parameters related to the desired gas flow rates from the chamber manager. Typically, process gas control subroutine 165 operates by opening the gas supply lines and repeatedly (i) reading the necessary mass flow controllers, (ii) comparing the readings to the desired flow rates received from chamber manager subroutine 163b, and (iii) adjusting the flow rates of the gas supply lines as necessary. Furthermore, process gas control subroutine 163 includes steps for monitoring the gas flow rates for unsafe rates, and activating the safety shut-off valves when an unsafe condition is detected. Process gas control subroutine 165 also controls the gas composition and flow rates for clean gases as well as for deposition gases, depending on the desired process (clean or deposition or other) that is selected. Alternative embodiments could have more than one process gas control subroutine, each subroutine controlling a specific type of process or specific sets of gas lines.

In some processes, an inert gas such as nitrogen or argon is flowed into chamber 30 to stabilize the pressure in the chamber before reactive process gases are introduced. For these processes, process gas control subroutine 165 is programmed to include steps for flowing the inert gas into chamber 30 for an amount of time necessary to stabilize the pressure in the chamber, and then the steps described above would be carried out. Additionally, when a process gas is to be vaporized from a liquid precursor, for example TEOS, process gas control subroutine 165 would be written to include steps for bubbling a delivery gas, such as helium, through the liquid precursor in a bubbler assembly, or for introducing a carrier gas, such as helium, to a liquid injection system. When a bubbler is used for this type of process, process gas control subroutine 165 regulates the flow of the delivery gas, the pressure in the bubbler, and the bubbler temperature in order to obtain the desired process gas flow rates. As discussed above, the desired process gas flow rates are transferred to process gas control subroutine 165 as process parameters. Furthermore, process gas control subroutine 165 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared with the necessary values and adjusted accordingly.

The pressure control subroutine 166 comprises program code for controlling the pressure in the chamber 30 by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When pressure control subroutine 166 is invoked, the desired or target pressure level is received as a parameter from chamber manager subroutine 163b. The pressure control subroutine 166 measures the pressure in chamber 30 by reading one or more conventional pressure manometers connected to the chamber, compares the measure value(s) with the target pressure, obtains PID (proportional, integral, and differential) values corresponding to the target pressure from a stored pressure table, and adjusts the throttle valve according to the PID values obtained from the pressure table. Alternatively, pressure control subroutine 166 can be written to open or close the throttle valve to a particular aperture size to regulate the pumping capacity in chamber 30 to the desired level.

Heater control subroutine 167 comprises program code for controlling the temperature of a heater element 107 used to resistively heat pedestal 32 (and any substrate thereon). The heater control subroutine 167 is also invoked by the chamber manager subroutine and receives a target, or set-point, temperature parameter. The heater control subroutine measures the temperature by measuring voltage output of a thermocouple located in pedestal 32, comparing the measured temperature with the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 32, heater control subroutine 167 gradually controls a ramp up/down of current applied to the loop. Additionally, a built-in, fail-safe mode can be included to detect process safety compliance, and can shut down operation of the heating unit if the process chamber 30 is not properly set up. An alternative method of heater control which may be used utilizes a ramp control algorithm that is described in the co-pending and commonly assigned U.S. patent application Ser. No. 08/746657, entitled "Systems and Methods for Controlling the Temperature of a Vapor Deposition Apparatus," listing Jonathan Frankel as inventor, filed on Nov. 13, 1996 (Attorney Docket No. AM1680-8/T17000), the disclosure of which is hereby incorporated by reference.

A plasma control subroutine 168 comprises program code for setting low- and high-frequency RF power levels applied to the process electrodes in chamber 30 and heater assembly 32, and for setting the low and high RF frequency employed. Like the previously described chamber component subroutines, plasma control subroutine 168 is invoked by chamber manager subroutine 163*b*. For embodiments including remote plasma generator 4, plasma control subroutine 168 would also include program code for controlling the remote plasma generator.

III. Depositing CVD Films with CVD System 10

Prior to development of the apparatus of the present invention, it was commonly regarded that a showerhead employing conical holes, such as holes 42, could not be effectively employed in a mixed frequency PECVD process. As discussed in the Background of the Invention section above, all known attempts at employing mixed frequency RF power with a conical-hole showerhead involved situations where both the high frequency (HF) and low frequency (LF) power supplies were connected to the showerhead (upper electrode) in the processing chamber. Such a configuration resulted in unstable phase interferences between the LF and HF waveforms. This in turn, produced higher than desired voltages at the upper electrode resulting in unwanted arcing.

The inventors of the present invention, however, discovered that by using a bottom powered electrode design where the low frequency RF power supply is connected to an electrode beneath the substrate and by using the RF filter and matching network described above, the HF and LF waveforms can be sufficiently decoupled to prevent the phase interference problems previously encountered. Using this configuration, the HF and LF waveforms can be controlled to minimize interference between the waveforms. With interference minimized, the inventors have found that a conical-hole showerhead can be used in mixed frequency PECVD processes while avoiding arcing within or near holes 42.

The use of mixed frequency RF power together with the use of conical holes allows for deposition of films having superior physical properties in many instances. First, as previously discussed, the use of conical holes rather than straight holes provides increased dissociation of the process gas, a higher plasma density and increased ionization efficiency. The increased dissociation is particularly important in deposition of silicon nitride films and other films where one or more of the particular source gases (e.g., $N_2$) employed are relatively difficult to break apart. Thus, as an example, in the deposition of silicon nitride films, the use of conical holes allows a reduction in the amount of $NH_3$ and a corresponding increase in the amount of $N_2$ used as sources for nitrogen. The reduced $NH_3$ in turn results in less hydrogen incorporated into the film and a lower WER. The use of the apparatus of the present invention in the deposition of silicon nitride films is discussed in more detail below.

The inclusion of the low frequency RF source, on the other hand, allows control of the ion energy used to bombard the substrate and deposited film. Such increased control of ion bombardment can be used to improve film density, allow for better stress control, provide a lower WER (rate at which the deposited film is etched in a 6:1 (by volume) BOE solution as is understood by a person of ordinary skill in the art) and improve overall film integrity. It is believed that in the deposition of silicon nitride films, such bombardment can displace hydrogen remaining from the reaction of silane and ammonia thus improving the film's WER.

Similarly, decoupling the high and low frequency waveforms provides its own improvements. For example, as mentioned above, arcing within the holes of showerhead 40 is a problem in CVD deposition. Generally, arcing is more of a problem at lower chamber pressures than at higher pressures. For example, in one prior silicon nitride mixed frequency PECVD process that employed mixed frequency RF power and straight, rather than conical holes, arcing presented problems when chamber pressure was below 3 torr. Thus, this process limited deposition pressure to 3 torr and above even though lower pressures would have been generally desirable because films having lower WER's could be deposited at such lower pressures. In the apparatus of the present invention, however, lower deposition pressures can be used without arcing. In one test, even when a showerhead having conical holes was employed, a pressure of 2.5 torr was used without arcing.

The decoupled high and low frequency waveforms also allow for an increased amount of low frequency power relative to high frequency power to be employed in film deposition. For example, in the same previously known mixed frequency silicon nitride process just mentioned above, arcing became a serious problem whenever the amount of low frequency RF power employed was greater than about 35% of the total RF power employed. This was true even though straight holes, rather than conical holes were used in the gas showerhead. With the high and low frequency waveforms decoupled as done in the apparatus of the present invention, the amount of low frequency RF power employed can be increased to above 35% of the total without arcing using the same silicon nitride deposition process even when conical holes, rather than straight holes, are used. The apparatus of the present invention has been successfully used with low frequency RF power of up to 60% of the total RF power employed. As previously mentioned, higher low frequency power results in increased ion bombardment and can therefore be used to improve film qualities. In device applications, however, it is important to consider the effect of increased bombardment on underlying layers. For example, if during deposition of a given film bombardment is set too high, it may damage a previously deposited film thereby harming yield even though the increased bombardment improves film properties at the immediately deposited layer. This is particularly relevant for gate oxide integrity during PMD film deposition.

Figure 8A:
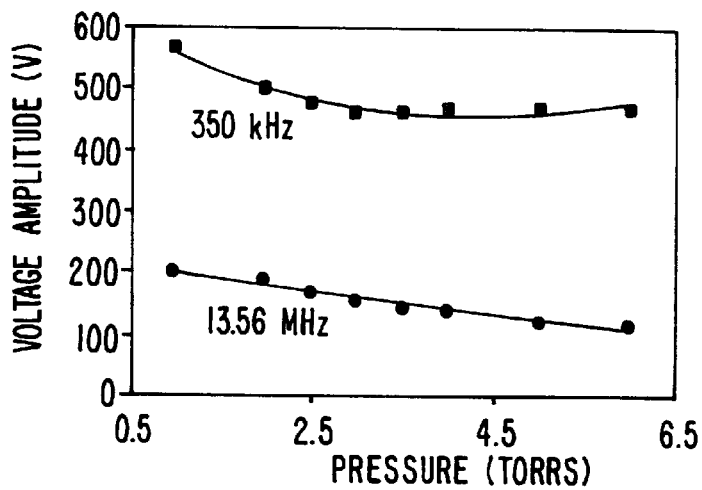
FIGS. 8A–8D show the effect of process pressure during deposition of a silicon nitride film on reactor impedance.
Figure 8B:
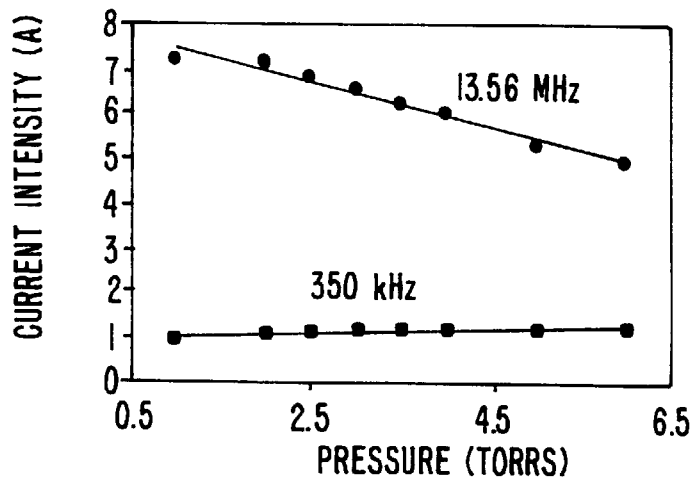
Figure 8C:
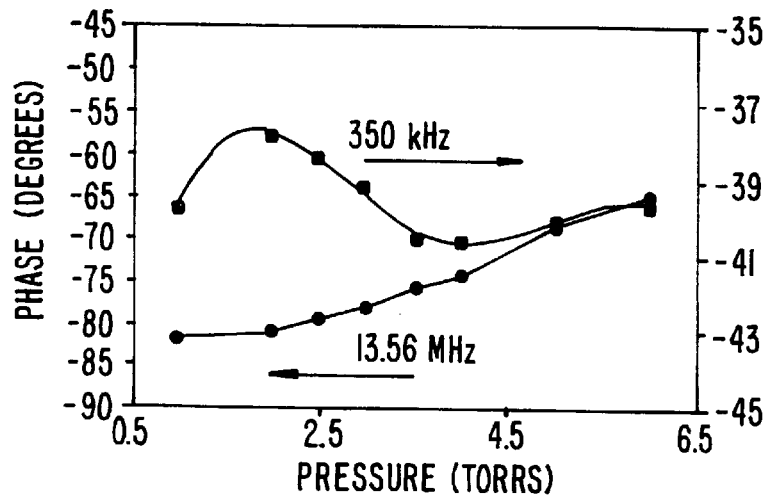

The present inventors also performed a detailed analysis on the effects of reactor impedance on the film properties of a silicon nitride film. FIGS. 8A–8D show the effect of process pressure on the reactor impedance. For each data point in the figures (pressure=1–6 torr), a $Si_3N_4$ film with a refractive index of 2.0 and $-1.5 \times 10^9$ dynes/cm$^2$ compressive stress was tuned. $SiH_4/NH_3/N_2$ were employed as precursor gases in a 1:2:10 ratio, respectively. The parameters that were recorded are: FIG. 8A, voltage amplitude ($V_{HF}$ at top electrode and $V_{LF}$ at bottom electrode); FIG. 8B, current intensities ($I_{LF}$ and $I_{HF}$); FIG. 8C, phase angles ($\Phi_{v/i\ HF}$ and $\Phi_{v/i\ LF}$) and FIG. 8D, impedance magnitude ($|Z_{HF}|$ and $|Z_{LF}|$). The measurements were made with two ENI V/I Impedance Probes™, one at the top for high frequency characterizations and the other at the bottom for low frequency measurements. The results show higher impedance magnitude at low frequency as well as a phase angle of $\Phi_{LF} \sim -65°$ to be compared with $\Phi_{HF} \sim -80°$. This indicates that the "natural" capacitive impedance ($\Phi_{v/i} \sim -90°$) of the reactor is modified by the addition of a low frequency signal. Other measurements indicate that $\Phi_{HF} \sim -87°$ if no low frequency power is applied.

Figure 11:
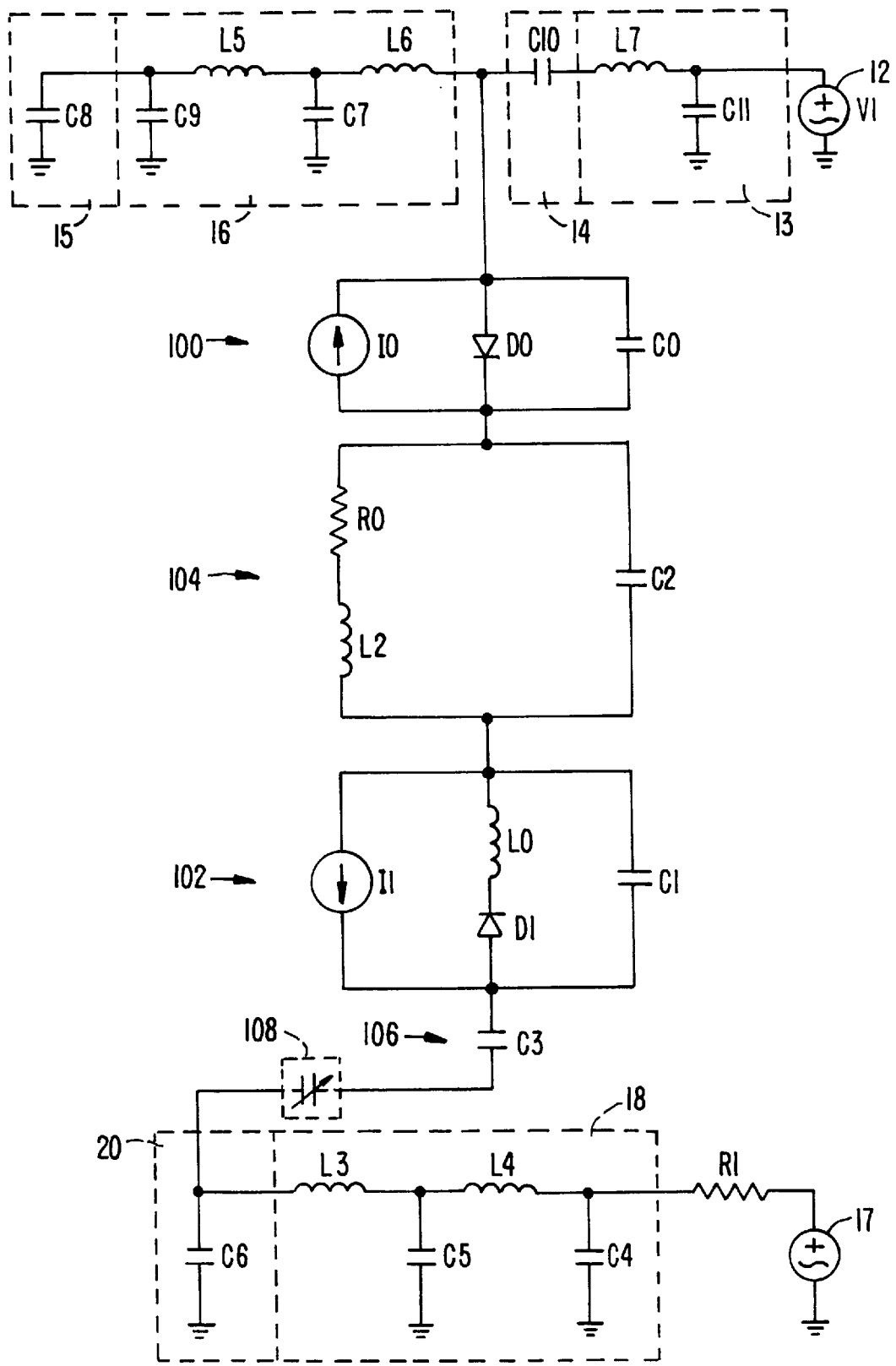
FIG. 11 is a representation of the modeled circuit used to represent chamber 30 in a SPICE simulation of the chamber.

The low frequency signal used in the tests (350 kHz) is below the ion plasma frequency (estimated at 800 kHz in this example). Therefore, ionized species responded to the low frequency bias that induced ion motion. This ion motion introduced an inductive component into the plasma so that the plasma bulk impedance cannot be described as a parallel RC circuit if the low frequency power ratio is high (e.g., $W_{LF}/(W_{LF}+W_{HF})>20\%$). As shown in FIG. 11 discussed below, reactor impedance can "roughly" be described as an RLC circuit: (L in series with R) in parallel with C.

Figure 8D:
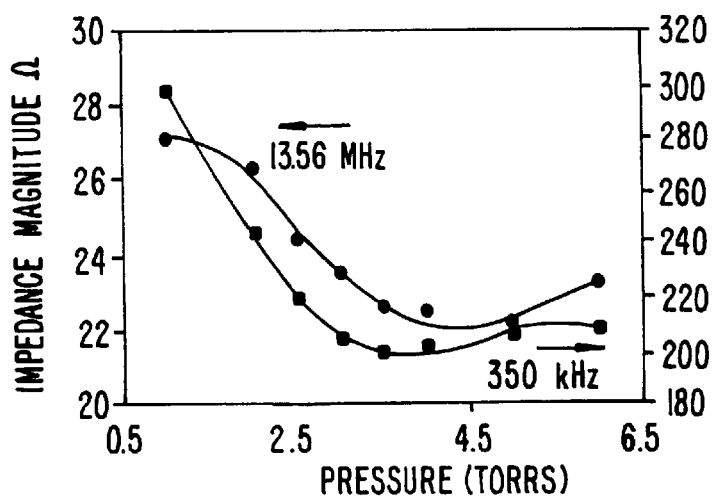
Figure 9:
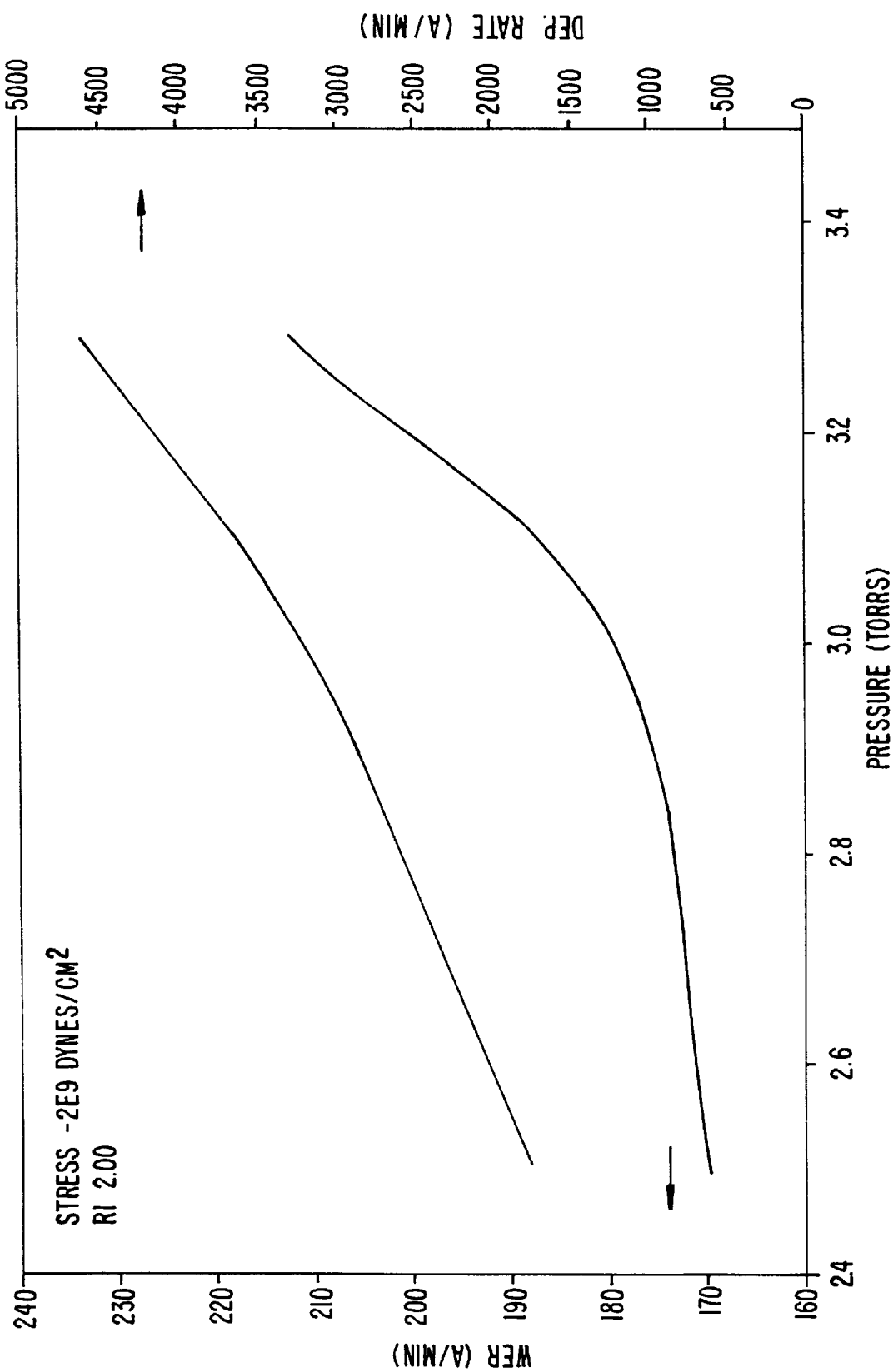
FIG. 9 shows experimental results that demonstrate the importance of process pressure on the wet etch rate and deposition rate of deposited silicon nitride films.
Figure 10C:
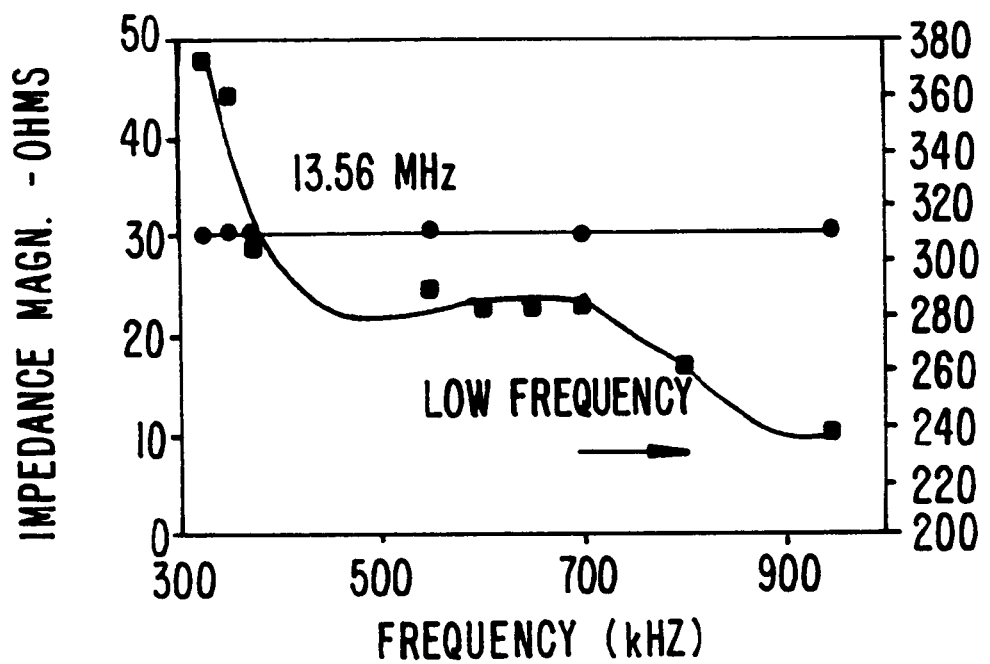
Figure 10D:
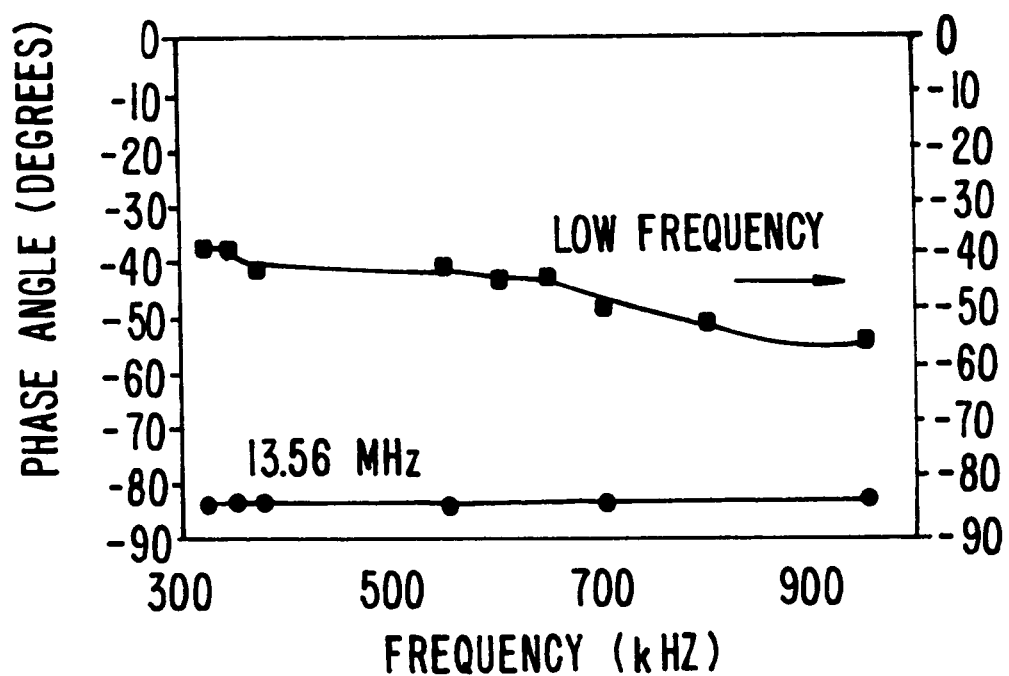

Careful control of the ion energy (proportional to the wafer low frequency potential $E_{ion}=q_{ion}\times V_{LF}$) allows accurate ion bombardment at the wafer surface. However, FIG. 8A shows that the heater electrode potential remains constant (~460 V) over a wide range of pressures (2–5 torr). FIGS. 8C and 8D show that the reactor impedance is related to pressure: the phase angle and the impedance magnitude are a maximum when pressure is 2 torr. This pressure has also been found to be related to a minimum WER in $Si_3N_4$ films (see FIG. 9). The correlation between film etch rate, phase angle and impedance magnitude show the importance of controlling the reactor impedance for accurate ion bombardment during film growth and improved film properties, such as reduced WER in silicon nitride films. The same principles should also apply to the deposition of other films including silicon oxide, silicon oxynitride, silicon carbide, fluorinated amorphous carbon, and the like.

Figure 10A:
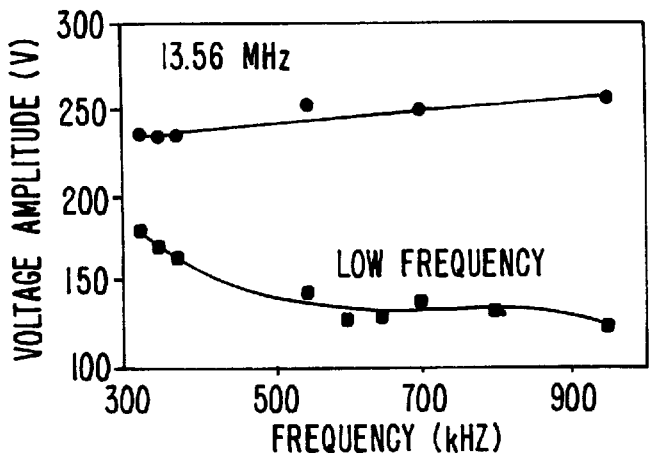
FIGS. 10A–10D show the effect of the frequency used in the low frequency power source on deposition of a silicon nitride film.
Figure 10B:
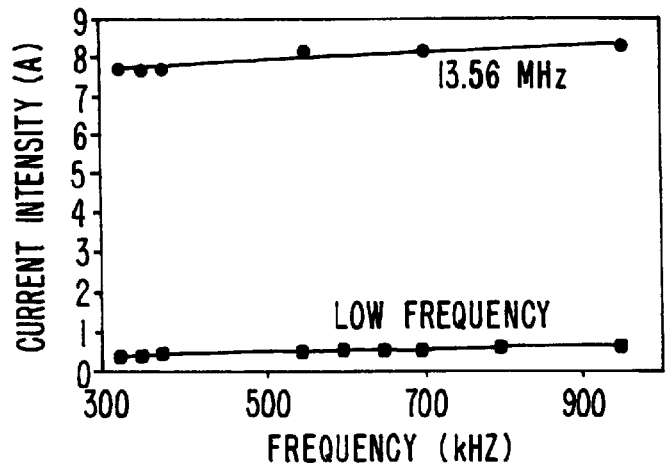

Reactor impedance was also characterized as a function of the LF bias frequency. The LF frequency was varied from 300 to 950 kHz using sinusoidal waveforms. FIGS. 10A–10D show the electrode potential, current and reactor impedance at low and high frequency. The measure of the phase angle and impedance magnitude as a function of frequency provided an opportunity to model the reactor using simple components. A SPICE simulation was performed in order to match measurements for both the phase angle and impedance magnitude. FIG. 11 shows the modeled circuit. Apart from the matching network previously described, the plasma bulk 104, and two different plasma sheaths 100 and 102 (all of which are part of reaction zone 58 discussed above with respect to FIG. 1) are shown in FIG. 11. The plasma bulk can be modeled as an RLC circuit with a large inductor value ($L_2=20$ μH) that reflects the ion motion and inertia. The top sheath consists of a current generator to reflect the generation of electrically charged species. The diode ($D_0$) just reflects that only electron current can flow through this part of the sheath. The value of $I_0$ (10A) is in good agreement with the value measured at 13.56 MHz (FIG. 10B).

The bottom sheath is similar to the top sheath except that a second inductor ($L_0$) reflects the ion motion through the sheath and the induced ion bombardment. Also, the current generator ($I_1=0.9$ A) was adjusted to fit the measured value ($I_{LF}$). The model is in good agreement with the assumption that the two sheaths are different (ionization at the showerhead and ion bombardment at the bottom electrode). The ceramic pedestal/heater is modeled as a simple capacitor 106 placed in series with the plasma impedance. The nominal value of the heater capacitance is 2500 pF when the depth of the electrode is 40 mil.

Figure 12A:
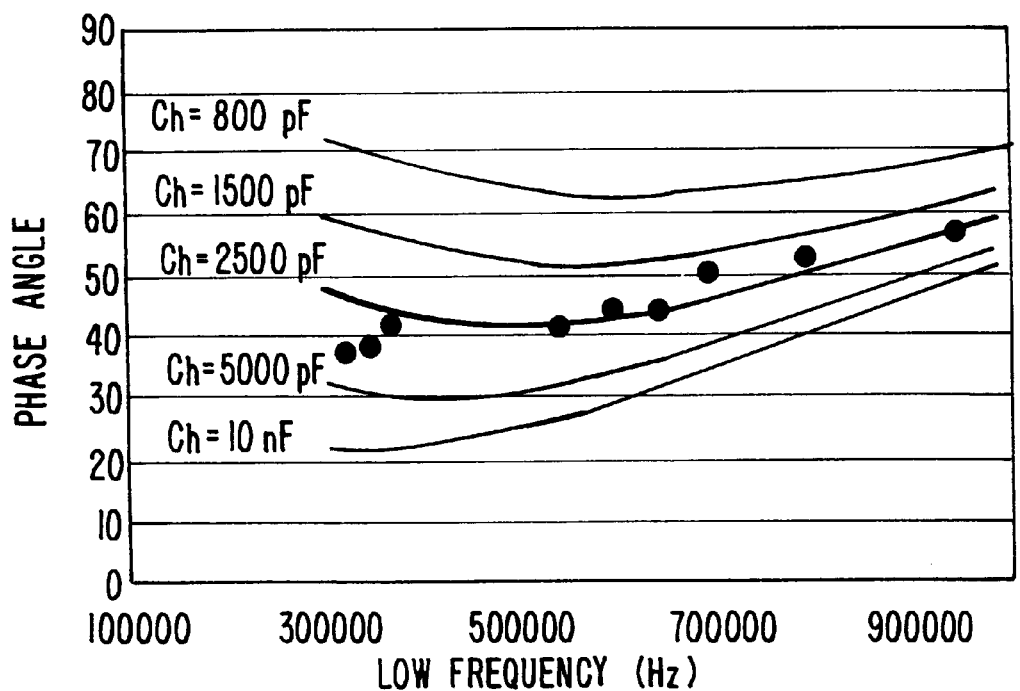
FIGS. 12A and 12B show a comparison of measured with simulated data on the effect of heater capacitance on phase angle and reactor impedance.
Figure 12B:
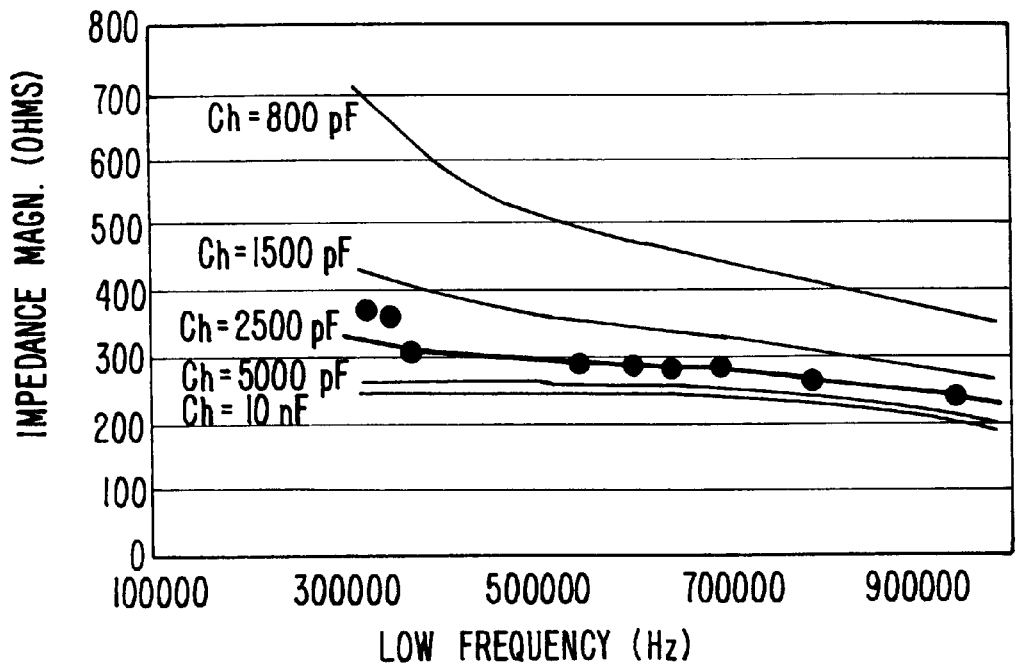

FIGS. 12A and 12B show a comparison of the measured and simulated data. The measured data (dots in each figure) are in good agreement with the model, calculated with $C_3=2500$ pF (bold line). $C_3$ was measured by putting a metallic plate on the heater pocket and measuring the capacitance with a network analyzer as would be understood by a person of skill in the art. The other curves show the influence on the reactor impedance when varying the heater capacitance. From this data it can be seen that the heater electrode capacitance has an important influence on the reactor impedance. This capacitance is determined by the depth (d) at which the electrode is embedded ($C=\epsilon S/d$, where $\epsilon$ is the dielectric permitivity of AlN, S is the electrode surface area and d is the electrode depth). Therefore, it is important to precisely control this electrode depth during the heater manufacturing process.

Based on the above work and characterizations, the present inventors developed two additional improvements to CVD system 10 of the present invention. The first of these improvements includes the addition of an impedance tuner 108 to CVD system 10. Impedance tuner 108 is shown in FIG. 11 as being connected in series with capacitor 106 (pedestal 32) and can be adjusted in value, depending on the process conditions, to adjust the impedance of reactor 30 as an additional control "knob" to obtain desired film properties. In a preferred embodiment, impedance tuner 108 is a variable capacitor In one example, the capacitor is selected so that the overall reactor impedance can be controlled to between 600 and 2500Ω. In another embodiment, impedance tuner 108 is an LC circuit having a variable inductor connected in parallel with a capacitor. In still other embodiments, impedance tuner 108 can be disconnected from CVD system 10 by way of a bypass switch (not shown).

The second improvement includes the addition of an impedance probe 110 (shown in FIGS. 1 and 5) to CVD system 10. Impedance probe 110 is electrically connected to chamber 30 by two lines 111A and 111B. Line 111A is connected to an input terminal 112A that is in electrical contact with lower electrode 22 embedded within pedestal 32, while line 111B is connected to an input terminal 112B that is in electrical contact with the upper electrode, faceplate 40. Impedance probe 110 is in communication with processor 85 over one of the control lines 3.

When connected in such a manner, the impedance probe can be used to monitor the impedance of the reactor during substrate processing, and if appropriate, processor 85 can adjust processing conditions or the setting of impedance tuner 108 (e.g., if the impedance tuner is a variable capacitor, adjust the capacitance of the variable capacitor) to compensate for any change in reactor impedance. This is particularly useful because, as discussed above, in some processes the impedance of reactor 30 has a definite effect on film properties such as WER stress, deposition rate, refractive index and film thickness uniformity. Thus, for example, if during a 2000 wafer process run, processor 85 detects that reactor impedance drifts outside of a range previously defined for that run, appropriate action can be taken during the wafer run to adjust for reactor impedance and further ensure that film properties are within the manufacturer's specifications for the given process during the entire process run. The actions taken to adjust for such an impedance drift may include, but are not limited to, adjusting pressure within the reactor chamber, increasing or decreasing high frequency or low frequency RF power and, as described above, adjusting the setting of impedance tuner 108. This feature can also be referred to as in situ impedance monitoring.

The features and design of CVD system 10 described above along with the additional discoveries made by the inventors also discussed above allow CVD system 10 to be employed to deposit CVD films over a wide range of process conditions including the use of deposition parameters that were previously not possible. The apparatus is useful in the deposition of a variety of CVD films including low temperature process films for intermetal dielectric (IMD) applications and high temperature processes for premetal dielectric (PMD) applications. Some specific applications include TEOS (tetraethylorthosilicate) or silane based PECVD and SACVD (subatmospheric CVD) chemistries, including the deposition of undoped silicon oxide (USG) and doped silicon oxides such as boron phosphorus silicate glass (BPSG), phosphorus silicate glass (PSG) and fluorine-doped silicate glass (FSG). Similarly, silicon nitride ($Si_3N_4$), silicon carbide, $SiO_xN_y$, amorphous silicon and other layers can be deposited using the apparatus of the present invention.

As an example of the broadened process regime attainable by the apparatus of the present invention, the inventors have performed extensive work with $Si_3N_4$ films and developed techniques that allow the deposition of such $Si_3N_4$ films having improved (lower) wet etch rates, excellent step coverage, increased film integrity and reduced pinholes at low temperature processing conditions. The inventors have also developed high temperature PECVD $Si_3N_4$ films that have a WER less than 15 Å/min., which is lower than that of many thermally grown $Si_3N_4$ layers.

Figure 15:
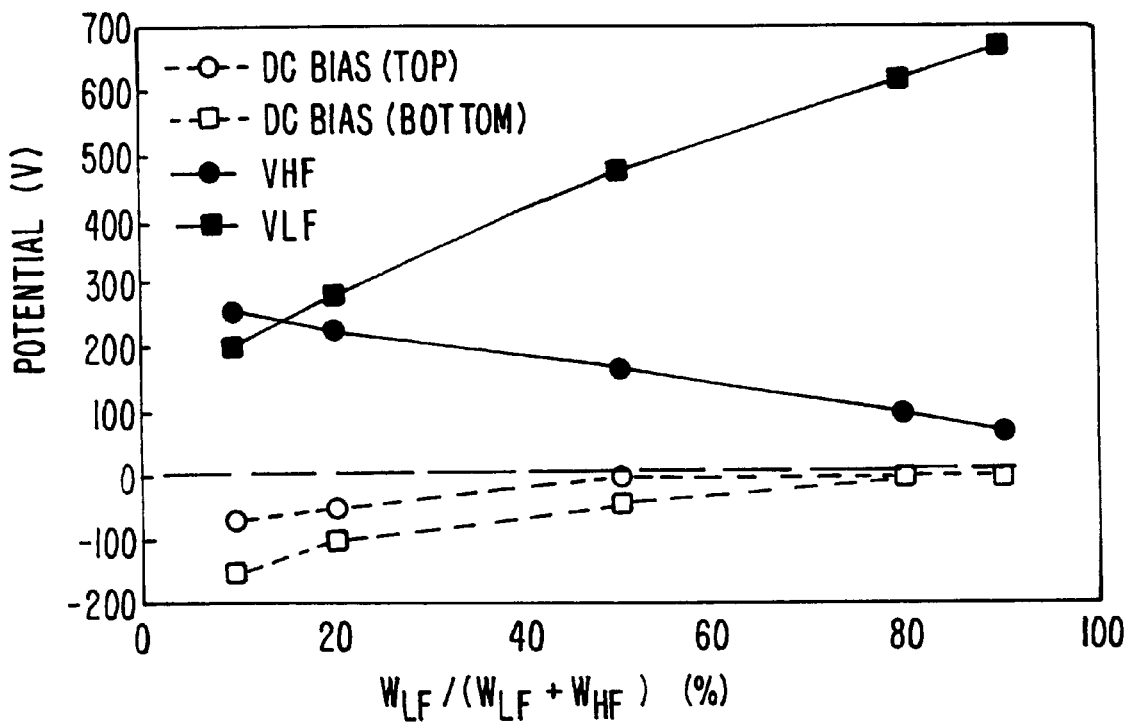
FIG. 15 shows electrode potential as a function of low frequency power over total RF power.
Figure 16:
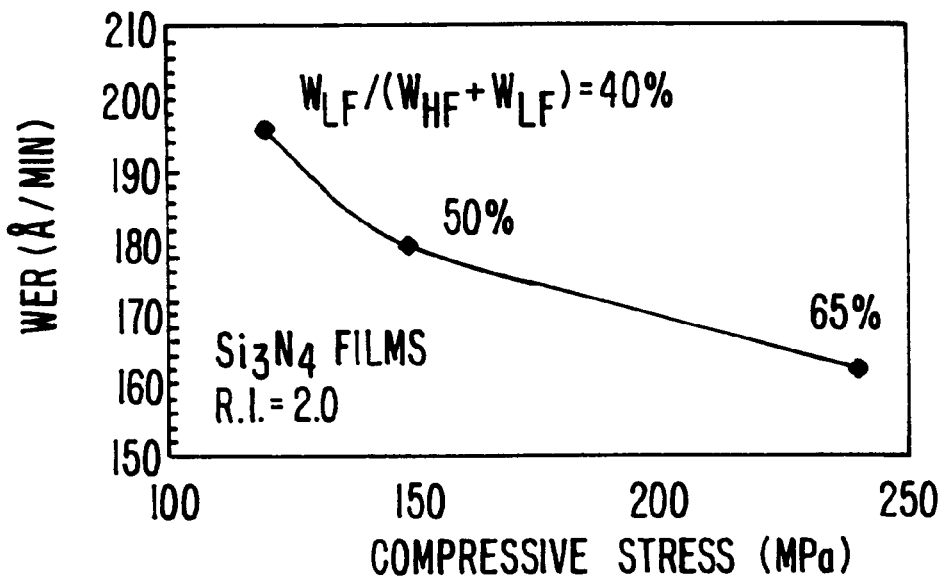
FIG. 16 shows wet etch rate as a function of film stress and the ratio of low frequency RF power to total RF power in the deposition of a silicon nitride film.

In developing these improved $Si_3N_4$ films, the inventors performed in depth studies on the effect of heater capacitance on stress, the effect of the ratio of LF power to total RF power on ion bombardment and the relationship of WER to stress among other things. For these studies, a $Si_3N_4$ deposition process was tuned with an refractive index of 2.0 and a compressive stress of $1.5 \times 10^9$ dynes/cm$^2$. The heater nominal capacitance of 2500 pF was then reduced by the addition of a variable capacitor as impedance tuner 108 placed in series with the heater. The process introduced $SiH_4/NH_3/N_2$ into the chamber at flow rates of 220/1200/600 sccm, respectively, and the chamber was heated to 400° C. and maintained at a pressure of 4.0 torr. High frequency RF power was supplied to the gas distribution manifold at a level of 250 W, and 250 W of low frequency RF (350 kHz) power was supplied to the bottom electrode. Finally, spacing between the substrate holder and gas distribution manifold was set at 425 mil. The results of these studies are shown in FIGS. 14–16 and are discussed below.

Figure 14:
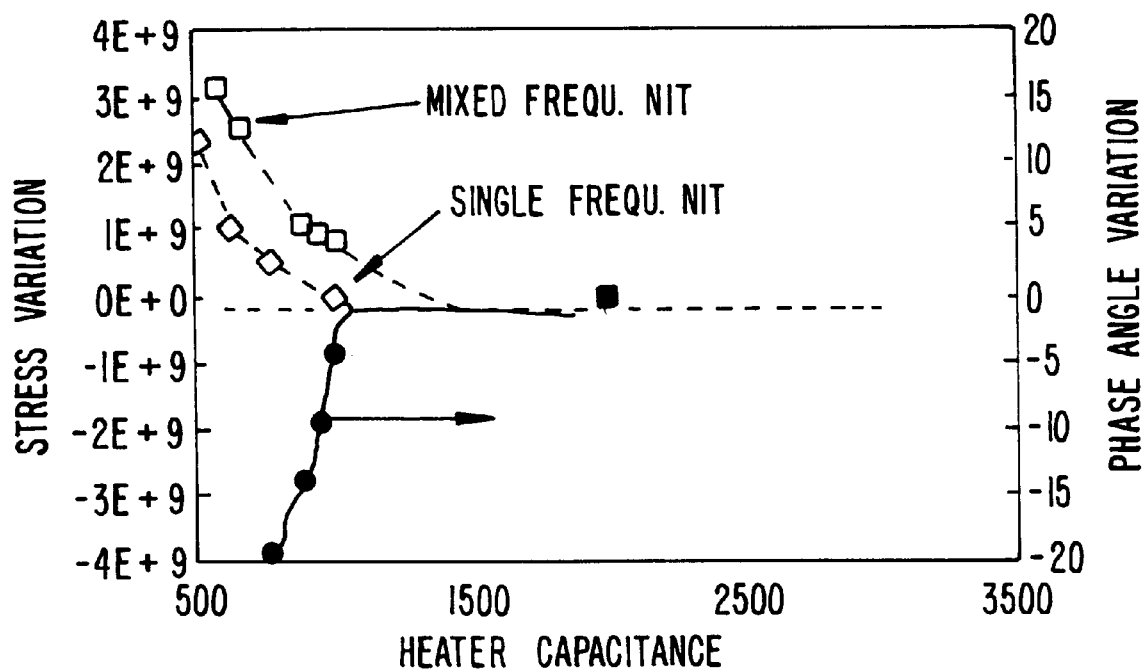
FIG. 14 shows the effect of heater capacitance on film stress.

FIG. 14 shows that film stress is strongly affected by the capacitance of the pedestal/heater. It was also found that the refractive index and the uniformity of the deposited film increases and the deposition rate decreases when the heater capacitance is decreased. This confirms the relationship between film properties and reactor impedance. It was found that a single frequency process is less affected than a mixed frequency process, a phenomenon that is actually predicted by the model (see FIGS. 12A and 12B where the distance between curves narrows at higher frequencies). These results can be used to specify tolerance on the heater capacitance for deposition of $Si_3N_4$ films. For example, allowing a maximum stress excursion of $\pm 2 \times 10^8$ dynes/cm$^2$ around the center process, it was found that the heater capacitance has to be controlled within 2500 pF±13%. This corresponds to an electrode depth of 40 mil, +5.1, −3.5. Values outside this tolerance range can be corrected for, however, through the use of impedance tuner 108.

Film integrity and other film properties are closely related to ion bombardment. As mentioned above, ion energy is proportional to the plasma sheath potential. The inventors studied the effect of the low frequency power on the potential of the showerhead and the heater electrode. They also recorded the self DC bias commonly induced by the 13.56 MHz bias. FIG. 15 shows the effect of increasing the low frequency power. In FIG. 15, total RF power was kept constant at 500 W and it can be seen that increasing the LF power increases the voltage amplitude $V_{LF}$ (and the ion energy) at the heater electrode. Concurrently, the voltage amplitude $V_{HF}$ at the showerhead decreases. The inventors discovered, however, the DC bias on both electrodes is reduced when the low frequency power is increased. It is believed that this negative self DC bias reflects the formation of an ion-depleted sheath at the electrodes. This DC bias can be greater than 200 V when a single (high) frequency process is used. With the addition of low frequency power, the ions can no longer be considered as fixed charges. The LF bias forces ions to penetrate within the plasma sheath, therefore canceling electronic charging effects and reducing the DC component. As a result, the ion energy is directly under control of the low frequency voltage amplitude. During the trough ($V_{LF}<0$) the positively ionized species (believed to be the majority of ions) bombard the growing film.

The ratio of low frequency power to total power $[W_{LF}/(W_{HF}+W_{LF})]$ is an important "knob" for tuning film stress. As previously mentioned, the configuration of the apparatus of the present invention allows the LF power to be increased to up to at least 60% of the total RF power without inducing arcing under some sets of processing conditions. FIG. 16 shows that adding low frequency power ($V_{LF}$ increases, DC bias decreases) allows increased film density due to more energetic ion bombardment in a $Si_3N_4$ film having a refractive index of 2.0 that is deposited as described above. FIG. 16 also shows that film WER and stress are closely related properties. For device applications, films with a moderate compressive stress (e.g., 50–150 MPa) are generally required. The reactor configuration of the present invention and plasma impedance can be optimized to decouple WER and film stress in order to provide a film of high integrity and tunable stress.

Knowing that ion energy is proportional to the heater electrode potential, the inventors studied various biasing waveforms and frequencies to determine their effects and role on ion bombardment and film properties. Three different waveforms were tested: sinusoidal, asymmetric and square (see FIGS. 17A–17D). For each waveform, the frequency was varied and the film integrity was characterized (step coverage before and after either a 250 Å etch or a one-minute 6:1 BOE as is known and understood by those of skill in the art, and pinhole performance).

A sinusoidal waveform (FIG. 17A) was tested with a frequency of 350 kHz. Sinusoidal waveforms are the standard waveform used to control ion bombardment in all mixed frequency PECVD processes known to the inventors. However, the inventors found that a sinusoidal waveform is not optimum for deposition of $Si_3N_4$ films. Indeed, there is no ion bombardment of the substrate for half of the period because the waveform alternates between bombardment of the substrate holder and bombardment of the gas distribution manifold. This is because when $V_{wafer}$ is positive, electron current is drawn toward the wafer and the ions are repulsed from the lower plasma sheath. Thus, ion bombardment only exists in the shaded regions 130 of FIGS. 17A–17D.

Figure 17A:
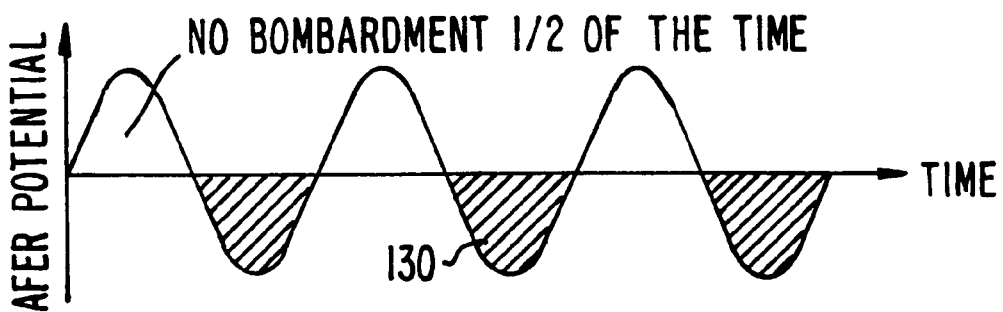
FIGS. 17A–17D illustrate different low frequency RF waveforms used to control ion bombardment during the deposition of a silicon nitride film.
Figure 17B:
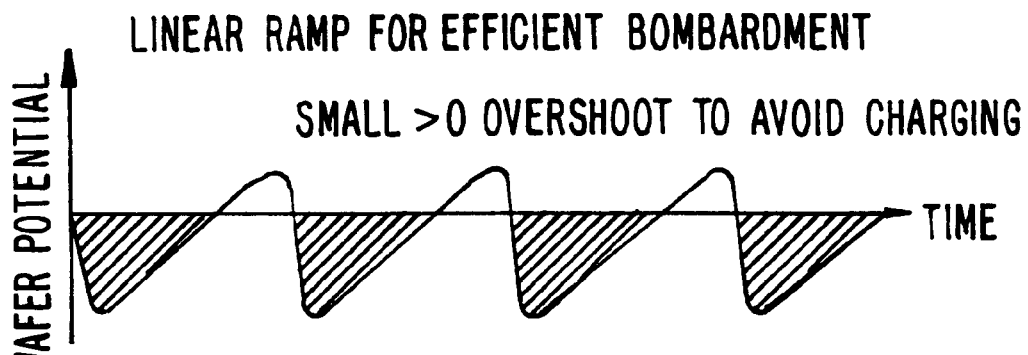
Figure 17C:
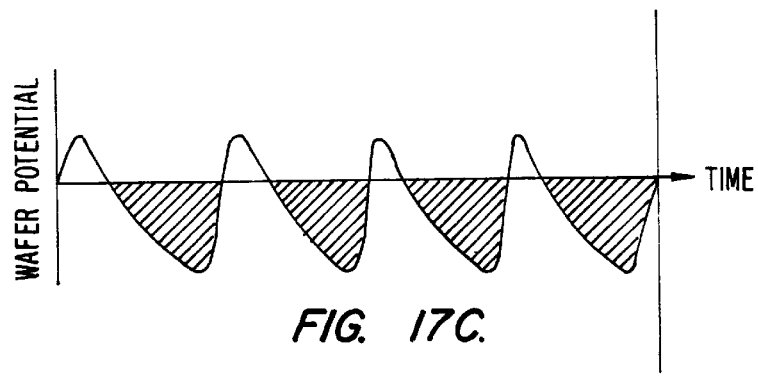

The inventors discovered that improved film quality was obtained when an asymmetric waveform was used as shown in FIG. 17B. The inventors also discovered that, generally, better film integrity is obtained at low frequency (e.g., <400 kHz) as it was observed that low frequency promotes lower phase angles (see FIG. 10D). It was also found that low phase angles provide better film properties as described above. In fact, for deposition of the above-described $Si_3N_4$ film, the best results were obtained with the asymmetric waveform at a frequency of 50–220 kHz, with 50 kHz being the most preferred frequency. This particular waveform was provided by a newly developed ENI RPG generator. Another type of asymmetric sawtooth waveform that can be employed is shown in FIG. 17C. These types of waveform have been used in the past for reactive sputtering depositions (e.g., $Al_2O_3$) and vacuum arc plasma depositions (e.g., DLC, $Al_2O_3$ and other metal films), but to the best of the inventors knowledge, has never been used as a biasing technique in PECVD processes. In either of the waveforms shown in FIGS. 17B and 17C, the duty cycle of the waveform can be adjusted to tailor film properties as desired. The duty cycle is the percentage of time that the wafer potential is positive: $Z^+/(Z^++Z^-)$. Generally it is preferable to have the duty cycle be between 10–50 percent.

Square biasing (FIG. 17D), also referred to as a pulsed DC biasing, was also tested with a frequency varying from 150 kHz to 700 kHz. The process regime was influenced by the frequency. Thus, there was a need to tune the process at various frequencies to deposit films having a refractive index of 2.0 and compressive stress of $1.5\times10^9$ dynes/cm$^2$. In any case, it was discovered that using square waves led to poor film integrity. Pulsed DC waveforms favor ion bombardment of the substrate holder, however, such a square waveform also favors substantial harmonics. It is believed that the poor film integrity can be attributed to the application of steep negative fronts 134, which provoked plasma sheath instabilities by introducing harmonics into the system.

Figure 17D:
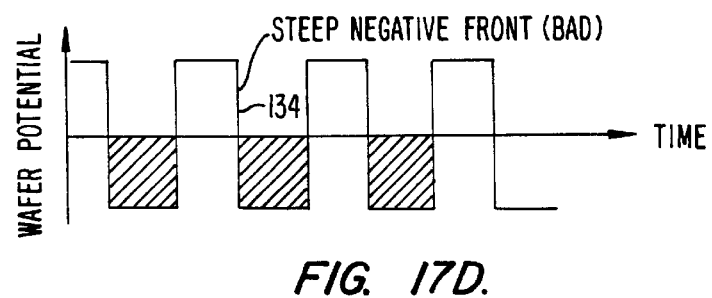

Thus, it is clear from the above tests that ion bombardment controlled by the asymmetric waveform of FIG. 17B resulted in increased bombardment as compared to the waveforms of FIGS. 17A and 17D and also in the deposition of films having improved properties. The asymmetric waveform shown in FIG. 17B can also be described as a sawtooth waveform or a triangular, bipolar waveform and provides ion bombardment of the substrate holder during most of each cycle with few harmonics. Other asymmetric waveforms (e.g., the waveform shown in FIG. 17C) may also be used to increase ion bombardment and hinder the formation of harmonics. In fact, any waveform that has an average linear distribution of ion energies over the signal period should be preferred over a purely sinusoidal waveform. To hinder the function of harmonics, it is preferable that the slope of the front (negative) edge of the waveform be smaller in magnitude than the slope of the back edge.

In conclusion, the enlarged process regime obtainable through the use of the present invention enables deposition of films having the above mentioned characteristics and deposition of silicon nitride films at lower pressure, higher ratios of low frequency RF power, and higher ratios of nitrogen to ammonia. The WER of deposited silicon nitride films has been reduced by as much as 50% by providing high frequency RF power to the conical-holed showerhead and by providing low frequency RF power to the ceramic substrate holder as described above. The WER is also strongly correlated to the process pressure. Thus, varying process pressure over a wide regime is an important parameter in controlling the properties of the deposited film.

Figure 13:
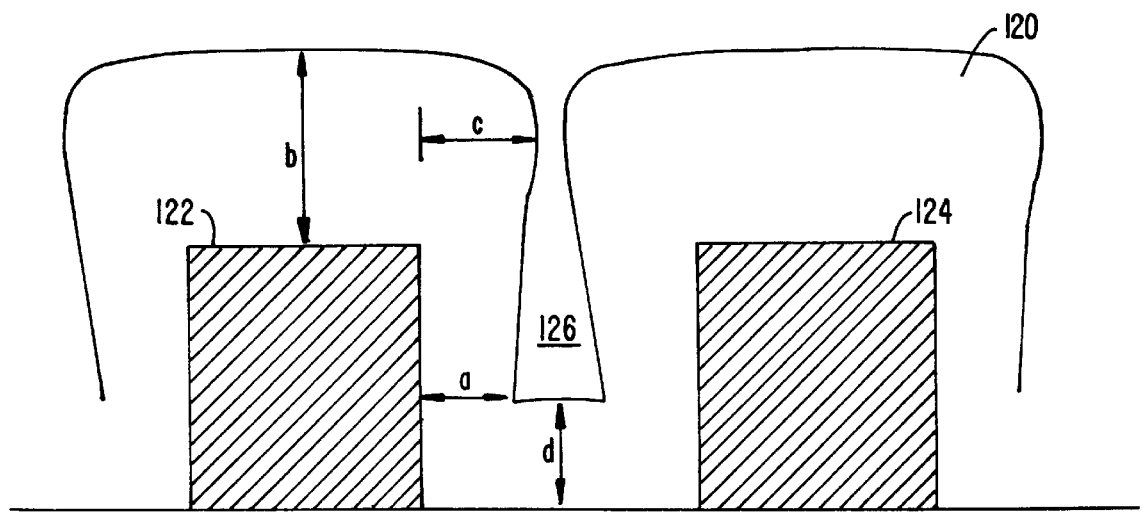
FIG. 13 illustrates the definitions of sidewall step coverage, bottom step coverage and conformality as used in the present application.

The decoupling of the low and high frequency RF power as taught herein provides improved WER and other characteristics without sacrificing step coverage or stress levels. In experiments, coverage of the sides and bottom of a 1:1 aspect ratio trench was controlled during a silicon nitride deposition to provide sidewall step coverage at about 65% with respect to the field coverage and to provide bottom step coverage at about 65% with respect to the field coverage. Such uniform growth within the trench provides a good conformal film, and strong bottom corners that are more resistant to subsequent etching of the film, which can otherwise etch entirely through the relatively weak bottom corners. As used herein, sidewall step coverage, bottom step coverage and conformality are defined with respect to the illustration in FIG. 13. In FIG. 13, a silicon nitride film 120 is shown deposited over adjacent metal lines 122 and 124 so that it partly fills gap 126 between the lines. Sidewall step coverage is a/b×100%. Bottom step coverage is d/b×100% and conformality is defined as a/c×100%.

IV. Experiments and Test Results

The invention is further described by the following examples that compare available mixed frequency silicon nitride processes with decoupled mixed frequency silicon nitride processes within the scope of the present invention. The examples were selected to show the best process conditions for depositing a conformal silicon nitride layer on a patterned wafer. In each example, the deposited silicon nitride layers had a refractive index of 2.0 and a film stress of $-1.6\times10^9$ dynes/cm$^2$, values that are within manufacturers specifications for many modern device applications. Processes that could not be modified to exactly reflect those values were adjusted to deposit films having the closest properties.

Comparative examples A and B describe deposition processes not performed in accordance with the present invention while invention examples 1–4 describe processes that were deposited in accordance with the present invention. In each example, a silicon nitride film was deposited over a stepped topography that included a gap between two closely spaced metal lines. The distance between the lines was approximately 0.5 μm and the aspect ratio of the gap was approximately 1:1.

COMPARATIVE EXAMPLE A

This example was undertaken using a CVD chamber having an aluminum substrate holder and a gas distribution manifold having straight holes. High frequency RF power was provided to the gas distribution manifold and low frequency RF power was provided to the aluminum substrate holder that held a wafer positioned 350 mil from the gas distribution manifold during processing.

The reactor was pumped down to a pressure of 0.1 torr at a temperature of 400° C. and then stabilized at 3.7 torr with process gas flow rates of 180 sccm of silane, 720 sccm of ammonia, and 1600 sccm of nitrogen. Then 100 W of high frequency RF power (13.56 MHz) and 20 W of low frequency RF power (350 kHz) was applied to the gas distribution manifold. The silicon nitride film was deposited at 1600 Å/min. The deposited film had a refractive index of 2.0 and a stress of $-1.4\times10^9$ dynes/cm$^2$.

The deposited film had a WER of 305 Å/min, and when exposed to an etchant solution to remove the top 250 Å of film, had substantially all of the silicon nitride removed from the bottom corners of the gap.

COMPARATIVE EXAMPLE B

This example was undertaken using a chemical vapor deposition chamber, and in particular, a "DxZ" plasma reactor fabricated and sold by Applied Materials, Inc., Santa Clara, Calif. The reactor was modified to include a ceramic substrate holder, however, and both high and low frequency RF power were provided to the gas distribution manifold. The substrate holder held a wafer positioned 560 mil from the gas distribution manifold during processing, and the gas distribution manifold included conical holes.

The reactor was pumped down to a pressure of 0.1 torr at a temperature of 400° C. and then stabilized at 4.0 torr with process gas flow rates of 215 sccm of silane, 1200 sccm of ammonia, and 600 sccm of nitrogen. Then 200 W of high frequency RF power (13.56 MHz) was applied to the gas distribution manifold and 200 W of low frequency RF power (350 kHz) was applied to the gas distribution manifold. The silicon nitride film was deposited at 5560 Å/min. The deposited film had a refractive index of 2.0 and a stress of $-2 \times 10^9$ dynes/cm$^2$.

The deposited film also had a WER of 305 Å/min. Etching of the deposited film to remove about 250 Å of the silicon nitride from the field also removed substantially all of the silicon nitride from the bottom corners of the gaps (or topography).

Invention Example 1

This example was undertaken using a chemical vapor deposition chamber, and in particular, a "DxZ" plasma reactor fabricated and sold by Applied Materials, Inc., Santa Clara, Calif. The reactor was modified to include both a conical holes gas distribution manifold and a ceramic substrate holder in accordance to the present invention and as shown in FIG. 1. High frequency RF power was provided to the gas distribution manifold and low frequency RF power was provided to RF electrode 22 embedded in the ceramic substrate holder. The substrate holder held a wafer positioned 600 mil from the gas distribution manifold during processing.

The reactor was pumped down to a pressure of 0.1 torr at a temperature of 400° C. and then stabilized at 2.5 torr with process gas flow rates of 65 sccm of silane, 130 sccm of ammonia, and 1450 sccm of nitrogen. Then 160 W of high frequency RF power (13.56 MHz) was applied to the gas distribution manifold and 135 W of low frequency RF power (sinusoidal waveform, 350 kHz) was applied to the ceramic substrate holder. The silicon nitride film was deposited at 1745 Å/min. The deposited film had a refractive index of 2.0 and a stress of $-1.5 \times 10^9$ dynes/cm$^2$. The deposited film had a WER of 180 Å/min.

Invention Example 2

This example was undertaken using the modified chemical vapor deposition chamber of Example 1. The substrate holder held a wafer positioned 485 mil from the gas distribution manifold during processing.

The reactor was pumped down to a pressure of 0.1 torr at a temperature of 400° C. and then stabilized at 4.0 torr with process gas flow rates of 210 sccm of silane, 1200 sccm of ammonia, and 600 ccm of nitrogen. Then 250 W of high frequency RF power (13.56 MHz) was applied to the gas distribution manifold and 250 W of low frequency RF power (sinusoidal waveform, 350 kHz) was applied to the ceramic substrate holder. The silicon nitride film was deposited at 5525 Å/min. The deposited film had a refractive index of 2.0 and a stress of $-1.6 \times 10^9$ dynes/cm$^2$.

The deposited film also had a WER of 335 Å/min. Etching of the deposited film to remove about 250 Å of the silicon nitride from the field left a substantial amount of the silicon nitride in the bottom corners of the vias in comparison to Comparative Example A. Prior to etching, the silicon nitride layer on the sidewalls and bottom of the via was about 63% of the thickness of the silicon nitride layer deposited on the field. After etching, the sidewall layer was 35% of the thickness of the field and the bottom corner was 12% of the thickness of the field.

Invention Example 3

This example was undertaken using the modified chemical vapor deposition chamber of Example 1. The substrate holder held a wafer positioned 490 mil from the gas distribution manifold during processing.

The reactor was pumped down to a pressure of 0.1 torr at a temperature of 400° C. and then stabilized at 4.0 torr with process gas flow rates of 200 sccm of silane, 1200 sccm of ammonia, and 600 sccm of nitrogen. Then 170 W of high frequency RF power (13.56 MHz) was applied to the gas distribution manifold and 250 W of low frequency RF power (sinusoidal waveform, 350 kHz) was applied to the ceramic substrate holder. The silicon nitride film was deposited at 4625 Å/min. The deposited film had a refractive index of 2.0 and a stress of $-2 \times 10^9$ dynes/cm$^2$.

The deposited film had a WER of 293 Å/min. Comparison of these results to Example 2 demonstrates an inverse relationship between the ratio of low frequency RF power to total RF power and WER when varying the high frequency input. Both a low WER and lower film stress can be achieved by varying the process pressure as shown by Example 1.

Invention Example 4

This example was undertaken using the modified chemical vapor deposition chamber of Example 1. The substrate holder held a wafer positioned 540 mil from the gas distribution manifold during processing.

The reactor was pumped down to a pressure of 0.1 torr at a temperature of 400° C. and then stabilized at 3.0 torr with process gas flow rates of 200 sccm of silane, 400 sccm of ammonia, and 4,500 sccm of nitrogen. Then 170 W of high frequency RF power (13.56 MHz) was applied to the gas distribution manifold and 250 W of bipolar (sawtooth) low frequency RF power (50 kHz, 4040 ns) having a triangular waveform to enhance ion bombardment was applied to the ceramic substrate holder. The silicon nitride film was deposited at 3700 Å/min. The deposited film had a refractive index of 2.0 and a stress of $-2 \times 10^9$ dynes/cm$^2$.

The deposited film also had a WER of 232 Å/min. Etching of the deposited film to remove about 250 Å of the silicon nitride from the field left a substantial amount of the silicon nitride in the bottom corners of the vias in comparison with Comparative Example A. Prior to etching, the silicon nitride layer on the sidewalls and bottom of the via was about 57% of the thickness of the silicon nitride layer deposited on the field. After etching, the sidewall layer was 41% of the thickness of the field and the corner layer was 18% of the thickness of the field.

Figure 18:
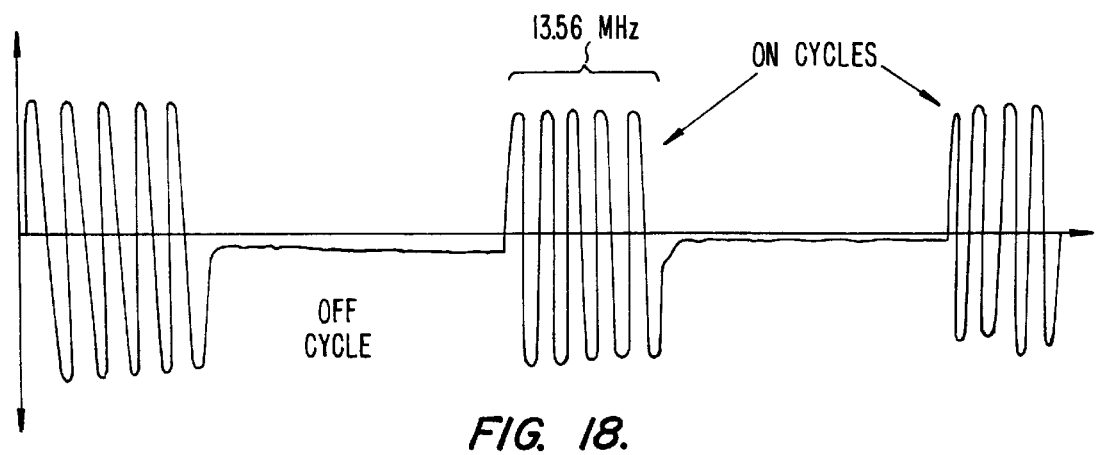
FIG. 18 shows and example high frequency RF waveform that can be used in pulsed plasma deposition processes according to the present invention.

While the foregoing is directed to certain preferred embodiments of the present invention, other and further embodiments of the invention may be devised without departing from the basic scope of the invention. For example, one such alternative embodiment may employ a pulsed plasma to allow a manufacturer to tailor plasma chemistry versus plasma density to further improve film characteristics. An example of a high frequency waveform used in such pulsed plasma processes is shown in FIG. 18. In FIG. 18, a 13.56 MHz waveform is shown as alternating between ON and OFF cycles. The waveform forms a plasma creating reactive species during each ON cycle and allows plasma chemistry to control deposition during each OFF cycle. The ratio of ON time versus OFF time is referred to as the duty cycle. Pulsed plasma deposition techniques are applicable to many CVD processes and are particularly useful when depositing amorphous fluorocarbon and other low K dielectric films in the apparatus of the present invention. In another alternative embodiment, impedance tuner 108 is used to adjust the impedance of a CVD chamber that employs other methods besides mixed frequency RF power to form a plasma and bias the plasma to bombard the growing film. The only requirement necessary for impedance tuner 108 to provide an added control knob for a particular chamber and deposition process is that the impedance of the plasma vary in relation to one or more process parameters. These alternatives along with other alternatives and equivalents are intended to be included within the scope of the present invention.

What is claimed is:

1. A method for depositing a film on a substrate in a substrate processing chamber, said method comprising:

introducing one or more process gases into a reaction zone of the substrate processing chamber;

applying RF power to an electrode to form a plasma having a first impedance level from said one or more process gases in the reaction zone;

tuning an RF matching network electrically coupled to the substrate processing chamber to the impedance of said plasma; and using an impedance tuner separate from said RF matching network and being electrically coupled to the processing chamber to adjust the impedance of said plasma.

2. The method of claim 1 wherein said impedance tuner comprises a variable capacitor and wherein adjusting the impedance of the plasma includes changing the capacitance of said variable capacitor.

3. The method of claim 1 wherein said RF power is applied to an electrode embedded within a substrate holder and said impedance tuner is electrically coupled between said electrode and a low frequency RF power source.

* * * * *